(12) United States Patent
Jankus et al.

(10) Patent No.: US 11,411,195 B2
(45) Date of Patent: Aug. 9, 2022

(54) ELECTROLUMINESCENT DEVICE COMPRISING A DEFINED LAYER ARRANGEMENT COMPRISING A LIGHT EMITTING LAYER, A HOLE TRANSPORT LAYER AND AN ELECTRON TRANSPORT LAYER

(71) Applicant: Novaled GmbH, Dresden (DE)

(72) Inventors: Vygintas Jankus, Dresden (DE); Domagoj Pavicic, Dresden (DE); Carsten Rothe, Dresden (DE)

(73) Assignee: Novaled GmbH, Dresden (DE)

( * ) Notice: Subject to any disclaimer, the term of this patent is extended or adjusted under 35 U.S.C. 154(b) by 409 days.

(21) Appl. No.: 16/481,902

(22) PCT Filed: Jan. 30, 2018

(86) PCT No.: PCT/EP2018/052249
§ 371 (c)(1),
(2) Date: Jul. 30, 2019

(87) PCT Pub. No.: WO2018/138373
PCT Pub. Date: Aug. 2, 2018

(65) Prior Publication Data
US 2019/0393439 A1      Dec. 26, 2019

(30) Foreign Application Priority Data

Jan. 30, 2017   (EP) ..................... 17153811

(51) Int. Cl.
*H01L 51/50*   (2006.01)
*H01L 51/00*   (2006.01)

(52) U.S. Cl.
CPC ........ *H01L 51/5076* (2013.01); *H01L 51/506* (2013.01); *H01L 51/508* (2013.01);
(Continued)

(58) Field of Classification Search
None
See application file for complete search history.

(56) References Cited

U.S. PATENT DOCUMENTS

2013/0153865 A1*   6/2013   Kho .................... H01L 51/0061
257/E51.026

FOREIGN PATENT DOCUMENTS

| EP | 2999019 A1 | 3/2016 |
|----|------------|--------|
| EP | 3035400 A1 | 6/2016 |

OTHER PUBLICATIONS

PCT International Search Report and Written Opinion for PCT Application No. PCT/EP2018/052249 dated Apr. 18, 2018 (9 pages).

* cited by examiner

*Primary Examiner* — Gregory D Clark
(74) *Attorney, Agent, or Firm* — Eversheds Sutherland (US) LLP

(57) ABSTRACT

The present invention is directed to an electroluminescent device comprising: —at least one node layer, —at least one cathode layer, —at least one light emitting layer, —at least one first hole transport layer, —at least a first electron transport layer; wherein for increasing power efficiency the compositions of the light emitting layer, the hole transport layer and the electron transport layer are matched to one another, wherein—the at least one light emitting layer is arranged between the anode layer and the cathode layer, wherein the at least one light emitting layer comprises: —at least one fluorescent emitter compound embedded in at least one polar emitter host compound, wherein—the at least one polar emitter host compound has at least three aromatic rings, which are independently selected from carbocyclic rings and heterocyclic rings; —the at least one first hole transport layer is arranged between the anode layer and the light emitting layer, wherein the at least one first hole (Continued)

transport layer comprises: —at least one electrical p-dopant, or—at least one electrical p-dopant and at least one first hole transport matrix compound; —the at least one first electron transport layer is arranged between the cathode layer and the light emitting layer, wherein the first electron transport layer comprises: —at least one redox n-dopant, and—at least one first electron transport matrix compound.

20 Claims, 2 Drawing Sheets

(52) U.S. Cl.
CPC ...... *H01L 51/5064* (2013.01); *H01L 51/5088* (2013.01); *H01L 51/0052* (2013.01); *H01L 51/0053* (2013.01); *H01L 51/0062* (2013.01); *H01L 51/0065* (2013.01); *H01L 51/0072* (2013.01); *H01L 2251/55* (2013.01)

ELECTROLUMINESCENT DEVICE COMPRISING A DEFINED LAYER ARRANGEMENT COMPRISING A LIGHT EMITTING LAYER, A HOLE TRANSPORT LAYER AND AN ELECTRON TRANSPORT LAYER

CROSS REFERENCE TO RELATED APPLICATIONS

This application is a U.S. national stage application of PCT/EP2018/052249, filed Jan. 30, 2018, which claims priority to European Application No. 17153811.9, filed Jan. 30, 2017. The content of these applications is incorporated herein by reference.

TECHNICAL FIELD

The present invention relates to an electroluminescent device, particularly to an organic light emitting diode (OLED) including a defined layer arrangement comprising a light emitting layer, a hole transport layer and an electron transport layer, wherein the compositions thereof are perfectly matched to one another and to a display device thereof.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer HTL, an emission layer EML, an electron transport layer ETL, and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. In fluorescent OLEDs, the EML comprises a fluorescent emitter which enables a radiative transition from a short-living singlet excited state. Fluorescent emitters are exploited predominantly in OLEDs emitting light having blue or blue-green color.

There is continuing demand for development of improved OLED materials, with the aim that operational voltage is as low as possible while brightness/luminance is high, and that injection and flow of holes and electrons is balanced, so that an OLED having the above-described structure has excellent efficiency and/or a long lifetime.

Further, lot of various host compounds for fluorescent emitters in OLED emitting layers as well as plenty of various electron transport matrices for electron transport layers are known in the art. No particular attention has been paid yet, however, to a question whether the polarity of the emitter host and, additionally, a fit between polarity of the emitter host and of the electron transport matrix in the electron transport layer adjacent to the emitting layer might be of an importance for device efficiency.

To enable further increase in electroluminescent device performance, particular power efficiency, the present invention implements the use of a defined layer arrangement comprising a light emitting layer, a hole transport layer and an electron transport layer, wherein the compositions thereof are perfectly matched to one another.

DISCLOSURE

Aspects of the present invention provide an electroluminescent device comprising a defined layer arrangement comprising a light emitting layer, a hole transport layer and an electron transport layer, wherein the compositions of the light emitting layer, the hole transport layer and the electron transport layer thereof are perfectly matched to one another for increasing the efficiency, particularly power efficiency, and, advantageously, also external quantum efficiency EQE, low operating voltage and long lifetime, particularly in top and/or bottom emission organic light-emitting diodes (OLEDs).

One aspect of the present invention provides an electroluminescent device comprising:
  at least one anode layer,
  at least one cathode layer,
  at least one light emitting layer,
  at least one first hole transport layer,
  at least a first electron transport layer;
  wherein for increasing power efficiency the compositions of the light emitting layer, the hole transport layer and the electron transport layer are matched to one another, wherein
  the at least one light emitting layer is arranged between the anode layer and the cathode layer, wherein the at least one light emitting layer comprises:
    at least one fluorescent emitter compound embedded in at least one polar emitter host compound, wherein
    the at least one polar emitter host compound has at least three aromatic rings, which are independently selected from carbocyclic rings and heterocyclic rings;
  the at least one first hole transport layer is arranged between the anode layer and the light emitting layer, wherein the at least one first hole transport layer comprises:
    at least one electrical p-dopant, or
    at least one electrical p-dopant and at least one first hole transport matrix compound;
  the at least one first electron transport layer is arranged between the cathode layer and the light emitting layer, wherein the first electron transport layer comprises:
    at least one redox n-dopant, and
    at least one first electron transport matrix compound.

Another aspect of the present invention provides an electroluminescent device comprising:
  at least one anode layer,
  at least one cathode layer,
  at least one light emitting layer,
  at least one first hole transport layer,
  at least a first electron transport layer;
wherein for increasing power efficiency the compositions of the light emitting layer, the hole transport layer and the electron transport layer are matched to one another, wherein
  the at least one light emitting layer is arranged between the anode layer and the cathode layer, wherein the at least one light emitting layer comprises:
    at least one fluorescent emitter compound embedded in at least one polar emitter host compound, wherein
    the at least one polar emitter host compound has at least three aromatic rings, which are independently selected from carbocyclic rings and heterocyclic rings, and has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye;

the at least one first hole transport layer is arranged between the anode layer and the light emitting layer, wherein the at least one first hole transport layer comprises:
  at least one electrical p-dopant, or
  at least one electrical p-dopant and at least one first hole transport matrix compound;

the at least one first electron transport layer is arranged between the cathode layer and the light emitting layer, wherein the first electron transport layer comprises:
  at least one redox n-dopant, and
  at least one first electron transport matrix compound.

Another aspect of the present invention provides an electroluminescent device comprising:
  at least one anode layer,
  at least one cathode layer,
  at least one light emitting layer,
  at least one first hole transport layer,
  at least a first electron transport layer;
wherein for increasing power efficiency the compositions of the light emitting layer, the hole transport layer and the electron transport layer are matched to one another, wherein
  the light emitting layer is arranged between the anode layer and the cathode layer, wherein the light emitting layer comprises at least one fluorescent emitter compound embedded in at least one polar emitter host compound;
  the first hole transport layer is arranged between the anode layer and the light emitting layer, wherein the first hole transport layer comprises at least one electrical p-dopant and/or at least one hole transport matrix compound;
  the first electron transport layer is arranged between the cathode layer and the light emitting layer, wherein the first electron transport layer comprises at least one redox n-dopant and at least one first electron transport aromatic matrix compound;
wherein
  the polar emitter host material comprises at least one polar emitter host compound having at least three aromatic rings, which are independently selected from carbocyclic rings and heterocyclic rings.

According to one embodiment, the polar emitter host compound may have at least three aromatic rings, which are independently selected from carbocyclic rings and heterocyclic rings, and is an anthracene compound represented by the chemical Formula 1:

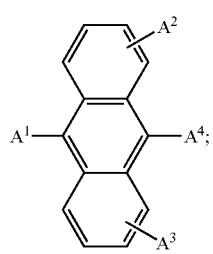

(1)

wherein
$A^1$ is selected from the group comprising a substituted or unsubstituted $C_6$-$C_{60}$ aryl or $C_6$-$C_{60}$ heteroaryl;
$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^4$ is selected from the group comprising a substituted or unsubstituted $C_6$-$C_{60}$ aryl or $C_6$-$C_{60}$ heteroaryl, preferably a $C_6$-$C_{60}$ heteroaryl.

According to one embodiment, the at least one light emitting layer comprises:
  at least one fluorescent emitter compound embedded in at least one polar emitter host compound, wherein the at least one polar emitter host compound has at least three aromatic rings, which are independently selected from carbocyclic rings and heterocyclic rings, and has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye, and is an anthracene compound represented by the chemical Formula 1:

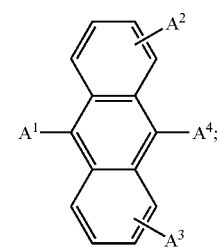

(1)

wherein
$A^1$ is selected from the group comprising a substituted or unsubstituted $C_6$-$C_{60}$ aryl or $C_6$-$C_{60}$ heteroaryl;
$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^4$ is selected from the group comprising a substituted or unsubstituted $C_6$-$C_{60}$ aryl or $C_6$-$C_{60}$ heteroaryl, preferably a $C_6$-$C_{60}$ heteroaryl.

Another aspect of the present invention provides an electroluminescent device comprising:
  at least one anode layer,
  at least one cathode layer,
  at least one light emitting layer,
  at least one first hole transport layer,
  at least a first electron transport layer;
wherein for increasing power efficiency the compositions of the light emitting layer, the hole transport layer and the electron transport layer are matched to one another, wherein
  the at least one light emitting layer is arranged between the anode layer and the cathode layer, wherein the at least one light emitting layer comprises:
at least one fluorescent emitter compound embedded in at least one polar emitter host compound, wherein the at least one polar emitter host compound has at least three aromatic rings, which are independently selected from carbocyclic rings and heterocyclic rings, and is an anthracene compound represented by the chemical Formula 1:

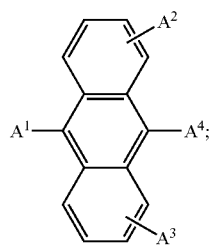 (1)

wherein
$A^1$ is selected from the group comprising a substituted or unsubstituted $C_6$-$C_{60}$ aryl or $C_6$-$C_{60}$ heteroaryl;
$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^4$ is selected from the group comprising a substituted or unsubstituted $C_6$-$C_{60}$ aryl or $C_6$-$C_{60}$ heteroaryl, preferably a $C_6$-$C_{60}$ heteroaryl;
the at least one first hole transport layer is arranged between the anode layer and the light emitting layer, wherein
the at least one first hole transport layer comprises:
at least one electrical p-dopant selected from the group comprising:
  a) organic compounds comprising at least one, preferably at least two, more preferably at least three, most preferably at least four electron withdrawing group(s) selected from:
    (i) perhalogenated alkyl, wherein the halogen in the perhalogenated alkyl is preferably selected from F and Cl, more preferably, the perhalogenated alkyl is a perfluoroalkyl,
    (ii) carbonyl group,
    (iii) sulfonyl group,
    (iv) nitrile group,
    (v) nitro group;
  b) metal oxides, metal salts and metal complexes, wherein the metal in the metal oxide, metal salt and/or the metal complex is preferably present in its maximum oxidation state; or
  optional in addition at least one first hole transport matrix compound selected from the group comprising an organic conjugated aromatic system with at least 6 delocalized electrons;
the at least one first electron transport layer is arranged between the cathode layer and the light emitting layer, wherein the first electron transport layer comprises:
at least one redox n-dopant of an elemental metal is selected from the group comprising:
  a) elemental metals, preferably selected from alkali metals, alkaline earth metals and rare earth metals;

further preferred selected from Li, Na, K, Rb, Cs, Mg, Ca, Sr, Ba, Sm, Eu, Yb; more preferred selected from Li, Na, Cs, Mg, Sr, Yb; even more preferred selected from Li, Na, Mg, Yb; most preferred selected from Li and/or Yb;
  b) organic radicals, preferably selected from diazolyl radicals, oxazolyl radicals and thiazolyl radicals;
  c) transition metal complexes, wherein the transition metal is selected from $3^{rd}$, $4^{th}$, $5^{th}$ $6^{th}$, $7^{rd}$, $8^{th}$, $9^{th}$ or $10^{th}$ group of the Periodic Table and is in oxidation state (−I), (0), (I) or (II), preferably, the transition metal complex is electrically neutral;
and
at least one first electron transport aromatic matrix compound having the chemical formula 2:

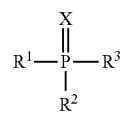

Formula (2)

wherein
X is selected from O, S, Se;
$R^1$ and $R^2$ are independently selected from $C_1$ to $C_{12}$ alkyl, $C_6$ to $C_{20}$ aryl and $C_5$ to $C_{20}$ heteroaryl;
$R^3$ is selected from formula (2A),

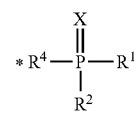

Formula (2A)

or formula (2B)

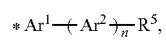

Formula (2B)

wherein
* marks the position in the respective $R^4$ or $Ar^1$ group for binding the $R^4$ or $Ar^1$ to the phosphorus atom in formula (I);
$R^4$ is selected from $C_1$ to $C_8$ alkyl, $C_6$ to $C_{20}$ aryl and $C_5$ to $C_{20}$ heteroaryl;
$Ar^1$ is selected from $C_6$ to $C_{20}$ aryl and $C_5$ to $C_{20}$ heteroaryl;
$Ar^2$ is selected from $C_{18}$ to $C_{40}$ aryl and $C_{10}$ to $C_{40}$ heteroaryl;
$R^5$ is selected from H, $C_1$ to $C_{12}$ alkyl, $C_6$ to $C_{20}$ aryl and $C_5$ to $C_{20}$ heteroaryl
n is selected from 0, 1, or 2.

It has been surprisingly found that the defined layer arrangement comprising a light emitting layer, a hole transport layer and an electron transport layer, wherein the compositions thereof are perfectly matched to one another, increases the power efficiency of an electroluminescent device.

It has been further surprisingly found that for the defined layer arrangement the use of at least one fluorescent emitter compound embedded in at least one polar emitter host compound enables better device performance in comparison with its non-polar alternatives.

Further it has been found for the defined layer arrangement of a light emitting layer, a hole transport layer and an electron transport layer, that a proper fit between polarity of the emitter host and polarity of the electron transport layer matrix compound, which forms the electron transport layer adjacent to the emitting layer may has an additional improved effect on device efficiency, for example in state-of-art devices with high brightness, which is enabled by use of redox n-dopant in at least one electron transport layer matrix compound in the electroluminescent device.

Particular aspects of the device are described in detail below.

Operation conditions of an electroluminescent device, for example an OLED, are described in the experimental part of this specification.

According to a further aspect of the invention, the electroluminescent device can be an organic light emitting diode OLED. In one embodiment, the OLED comprising the defined layer arrangement may be a tandem OLED, for example a white tandem OLED.

Similar as other compounds comprised in the inventive device outside the emitting layer, the first electron transport matrix compound may not emit visible light under the operation condition of an electroluminescent device, for example an OLED.

Under an elemental metal, it is understood a metal in a state of a neat metal, of a metal alloy, or in a state of free atoms or metal clusters. It is understood that metals deposited by vacuum thermal evaporation from a metallic phase, e.g. from a neat bulk metal, vaporize in their elemental form. It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

For the use in consumer electronics, only metals containing stable nuclides or nuclides having very long halftime of radioactive decay might be applicable. As an acceptable level of nuclear stability, the nuclear stability of natural potassium can be taken.

In the present specification, when a definition is not otherwise provided, "substituted" refers to one substituted with a $C_1$ to $C_{10}$ alkyl.

In the present specification, when a definition is not otherwise provided, an "alkyl group" refers to a saturated aliphatic hydrocarbyl group. The alkyl group may be a $C_1$ to $C_{10}$ alkyl group. More specifically, the alkyl group may be a $C_1$ to $C_{10}$ alkyl group or a $C_1$ to $C_6$ alkyl group. For example, a $C_1$ to $C_4$ alkyl group includes 1 to 4 carbons in alkyl chain, and may be selected from methyl, ethyl, propyl, iso-propyl, n-butyl, iso-butyl, sec-butyl, and t-butyl.

Specific examples of the alkyl group may be a methyl group, an ethyl group, a propyl group, an isopropyl group, a butyl group, an isobutyl group, a t-butyl group, a pentyl group, a hexyl group.

In the present specification, "aryl group" refers to a hydrocarbyl group which can be created by formal abstraction of one hydrogen atom from an aromatic ring in the corresponding aromatic hydrocarbon. Aromatic hydrocarbon refers to a hydrocarbon which contains at least one aromatic ring or aromatic ring system. Aromatic ring or aromatic ring system refers to a planar ring or ring system of covalently bound carbon atoms, wherein the planar ring or ring system comprises a conjugated system of delocalized electrons fulfilling Hückel's rule. Examples of aryl groups include monocyclic groups like phenylor tolyl, polycyclic groups which comprise more aromatic rings linked by single bonds, like biphenylyl, and polycyclic groups comprising fused rings, like naphtyl or fluoren-2-yl.

Analogously, under heteroaryl, it is understood a group derived by formal abstraction of one ring hydrogen from a heterocyclic aromatic ring in a compound comprising at least one such ring.

Under heterocycloalkyl, it is understood a group derived by formal abstraction of one ring hydrogen from a saturated heterocyclic ring in a compound comprising at least one such ring.

The term "hetero" is understood the way that at least one carbon atom, in a structure which may be formed by covalently bound carbon atoms, is replaced by another polyvalent atom. Preferably, the heteroatoms are selected from B, Si, N, P, O, S; more preferably from N, P, O, S.

In the present specification, the single bond refers to a direct bond.

In the context of the present invention, "different" means that the compounds do not have an identical chemical structure.

The term "free of", "does not contain", "does not comprise" does not exclude impurities which may be present in the compounds prior to deposition. Impurities have no technical effect with respect to the object achieved by the present invention.

The term "adjacent" refers to an arrangement of two layers whereby the layers are in direct contact.

In the context of the present specification the term "essentially non-emissive" means that the contribution of the compound or layer to the visible emission spectrum from the device is less than 10%, preferably less than 5% relative to the visible emission spectrum. The visible emission spectrum is an emission spectrum with a wavelength of about $\geq 380$ nm to about $\leq 780$ nm.

In the specification, hole characteristics refer to an ability to donate an electron to form a hole when an electric field is applied and that a hole formed in the anode may be easily injected into the emission layer and transported in the emission layer due to conductive characteristics according to a highest occupied molecular orbital (HOMO) level.

In addition, electron characteristics refer to an ability to accept an electron when an electric field is applied and that electron formed in the cathode may be easily injected into the emission layer and transported in the emission layer due to conductive characteristics according to a lowest unoccupied molecular orbital (LUMO) level.

Another aspect of the present invention provides an electroluminescent device comprising:
  at least one anode layer,
  at least one cathode layer,
  at least one light emitting layer,
  at least one first hole transport layer,
  at least a first electron transport layer;
  wherein for increasing power efficiency the compositions of the light emitting layer, the hole transport layer and the electron transport layer are matched to one another, wherein
  the at least one light emitting layer is arranged between the anode layer and the cathode layer, wherein the at least one light emitting layer comprises:
    at least one fluorescent emitter compound embedded in at least one polar emitter host compound, wherein the at least one polar emitter host compound has at least three aromatic rings, which are independently selected from carbocyclic rings and heterocyclic rings, and preferably it may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye;

the at least one first hole transport layer is arranged between the anode layer and the light emitting layer, wherein the at least one first hole transport layer comprises:
  at least one electrical p-dopant of a quinone derivative, a metal oxide and/or a cyano group-containing compound, or
  at least one electrical p-dopant of a quinone derivative, a metal oxide and/or a cyano group-containing compound, and at least one first hole transport matrix compound of a polycyclic aromatic hydrocarbons, triaryl amine compounds and/or heterocyclic aromatic compounds;

the at least one first electron transport layer is arranged between the cathode layer and the light emitting layer, wherein the first electron transport layer comprises:
  at least one redox n-dopant of an elemental metal, an electrically neutral metal complex and/or an electrically neutral organic radical, and
  at least one first electron transport aromatic matrix compound, wherein the aromatic matrix compound is a compound according to chemical formula (2):

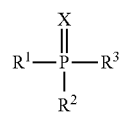

Formula (2)

wherein
X is selected from O, S, Se;
$R^1$ and $R^2$ are independently selected from $C_1$ to $C_{12}$ alkyl, $C_6$ to $C_{20}$ aryl and $C_5$ to $C_{20}$ heteroaryl;
$R^3$ is selected from formula (2A),

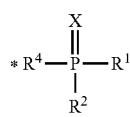

Formula (2A)

or formula (2B)

Formula (2B)

wherein
* marks the position in the respective $R^4$ or $Ar^1$ group for binding the $R^4$ or $Ar^1$ to the phosphorus atom in formula (I);
$R^4$ is selected from $C_1$ to $C_8$ alkyl, $C_6$ to $C_{20}$ aryl and $C_5$ to $C_{20}$ heteroaryl;
$Ar^1$ is selected from $C_6$ to $C_{20}$ aryl and $C_5$ to $C_{20}$ heteroaryl;

$Ar^2$ is selected from $C_{18}$ to $C_{40}$ aryl and $C_{10}$ to $C_{oo}$ heteroaryl;
$R^5$ is selected from H, $C_1$ to $C_{12}$ alkyl, $C_6$ to $C_{20}$ aryl and $C_5$ to $C_{20}$ heteroaryl
n is selected from 0, 1, or 2.

Another aspect of the present invention provides an electroluminescent device comprising:
  at least one anode layer,
  at least one cathode layer,
  at least one light emitting layer,
  at least one first hole transport layer,
  at least a first electron transport layer;
wherein for increasing power efficiency the compositions of the light emitting layer, the hole transport layer and the electron transport layer are matched to one another, wherein
  the at least one light emitting layer is arranged between the anode layer and the cathode layer, wherein the at least one light emitting layer comprises:
    at least one fluorescent emitter compound, preferably a blue fluorescent emitter compound, embedded in at least one polar emitter host compound, wherein
    the at least one polar emitter host compound is an anthracene compound represented by the chemical Formula 1, and optional the at least one polar emitter host compound may have in addition a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye:

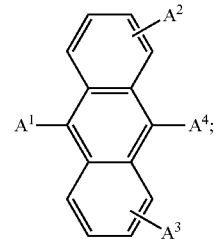

(1)

wherein
$A^1$ is selected from the group comprising a substituted or unsubstituted $C_6$-$C_{60}$ aryl or $C_6$-$C_{60}$ heteroaryl;
$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^4$ is selected from the group comprising a substituted or unsubstituted $C_6$-$C_{60}$ aryl or $C_6$-$C_{60}$ heteroaryl, preferably a $C_6$-$C_{60}$ heteroaryl;
the at least one first hole transport layer is arranged between the anode layer and the light emitting layer, wherein the at least one first hole transport layer comprises:
at least one electrical p-dopant of a tetracyanoquinonedimethane (TCNQ), 2,3,5,6-tetrafluoro-tetracyano-1,4-benzoquinonedimethane (F4-TCNQ), tungsten oxide, molybdenum oxide, and/or a compound according to Formula HT-D1 and PD-2 below:

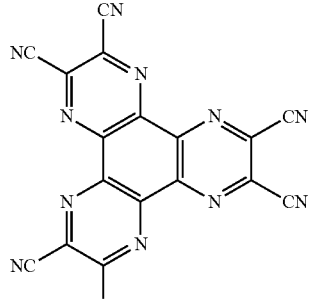

Compound HT-D1

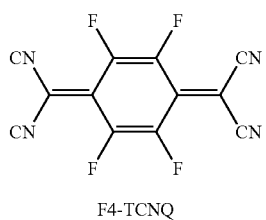

F4-TCNQ

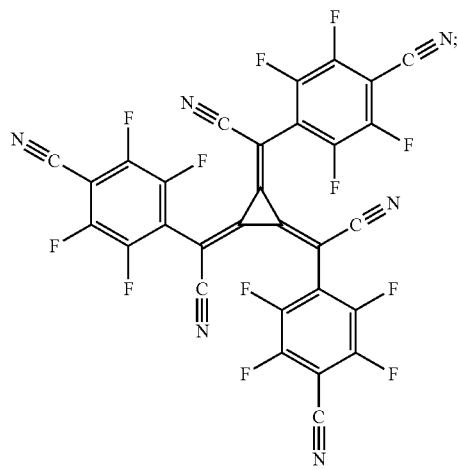

PD-2 or at least one electrical p-dopant of a tetracyanoquinonedimethane (TCNQ), 2,3,5,6-tetrafluoro-tetracyano-1,4-benzoquinonedimethane (F4-TCNQ), tungsten oxide, molybdenum oxide, and/or a compound according to Formula HT-D1 and PD-2;

and in addition at least one first hole transport matrix compound of:

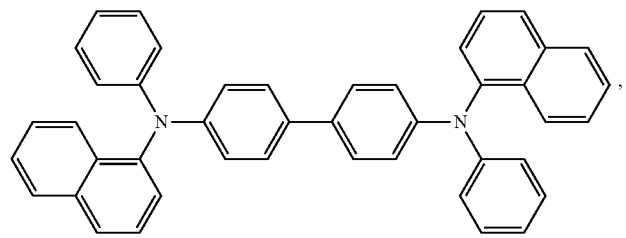

alpha-NPD

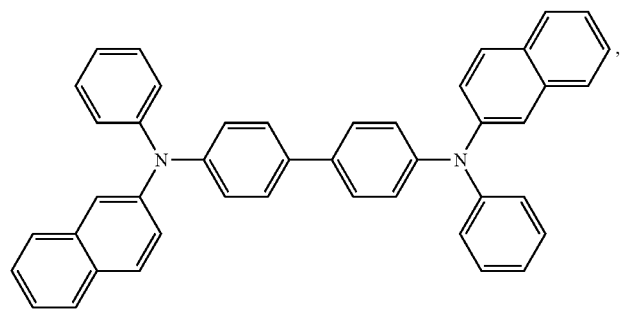

beta-NPD

-continued
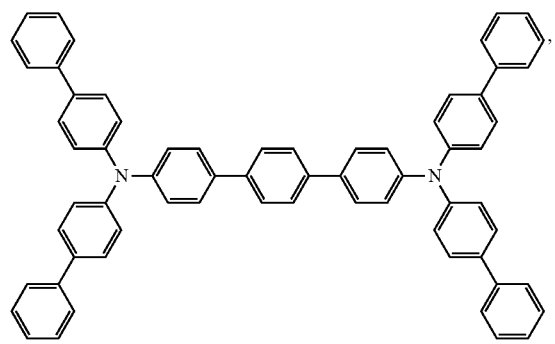
HT-1
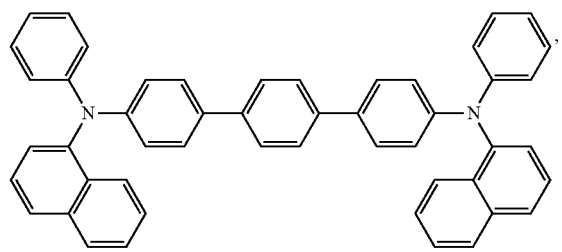
HT-2
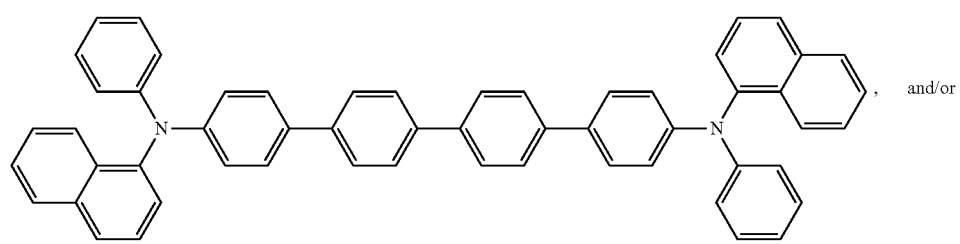
HT-3, and/or
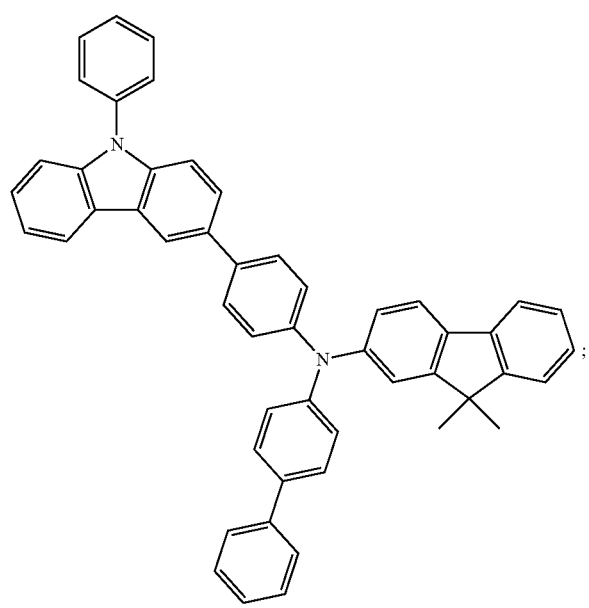
F1;

the at least one first electron transport layer is arranged between the cathode layer and the light emitting layer, wherein the first electron transport layer comprises:

at least one redox n-dopant of an electropositive metal selected from substantially stable alkali metals, alkaline earth metals, rare earth metals, and transition metals Ti, V, Cr and Mn; preferably from Li, Na, K, Rb, Cs, Mg, Ca, Sr, Ba, Sm, Eu, Tm, Yb; more preferably from Li, Na, K, Rb, Cs, Mg and Yb, even more preferably from Li, Na, Cs and Yb, most preferably from Li, Na and Yb, and at least one first electron transport matrix compound, wherein the matrix compound is a compound according to Formula 2 selected from a compound according to formula Va to Vai:

Formula Va to Ve:

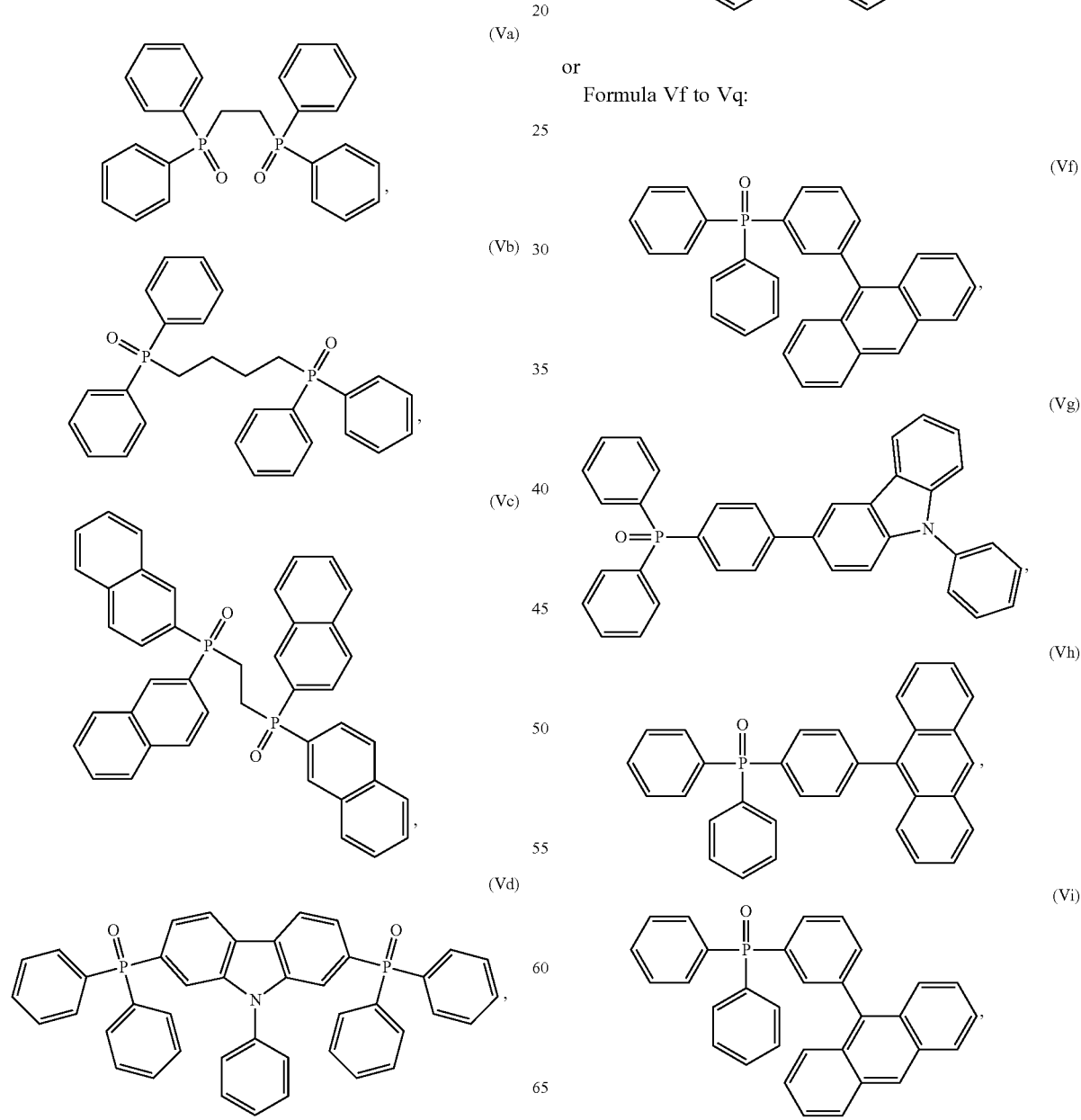

or

Formula Vf to Vq:

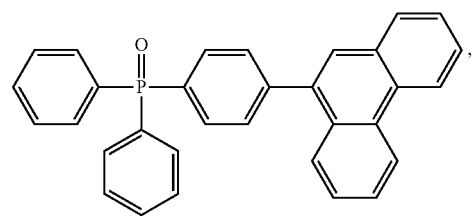 (Vj)
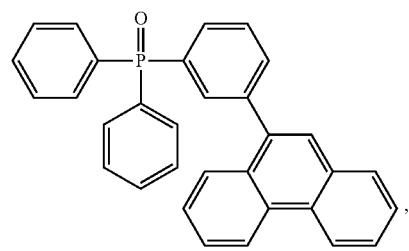 (Vk)
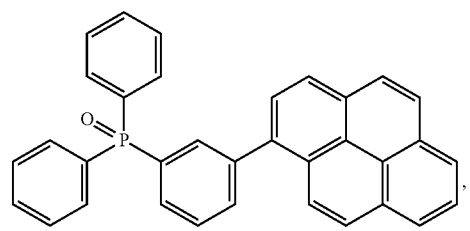 (Vl)
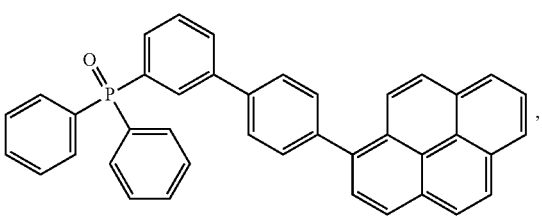 (Vm)
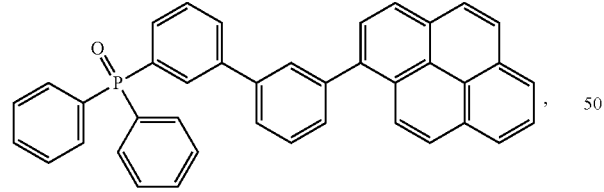 (Vn)
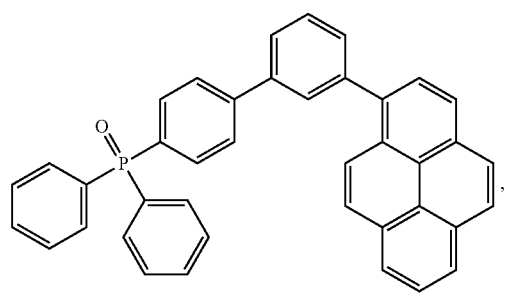 (Vo)
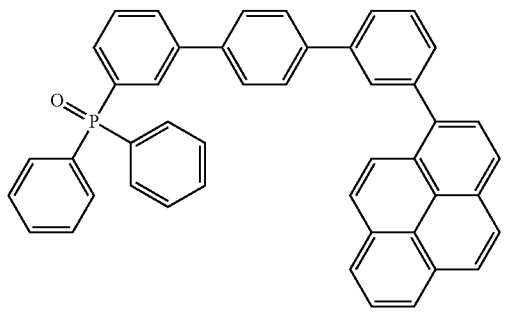 (Vp)
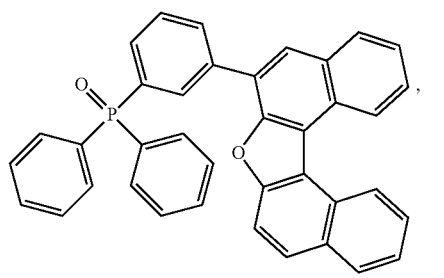 (Vq), or
Formula Vr to Vt:
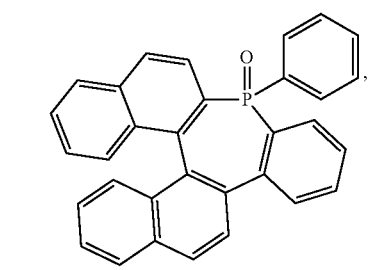 (Vr)
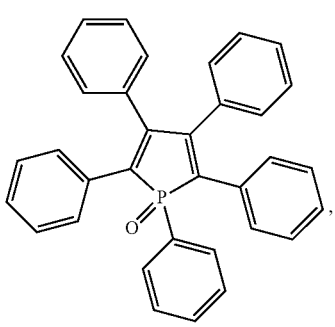 (Vs)
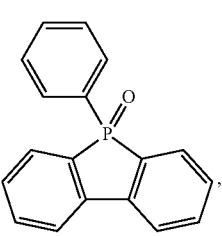 (Vt)

Formula Vu to Vai:
(Vu)
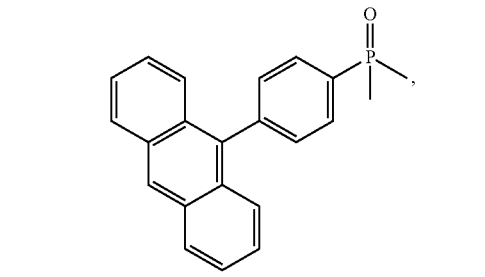
(Vv)
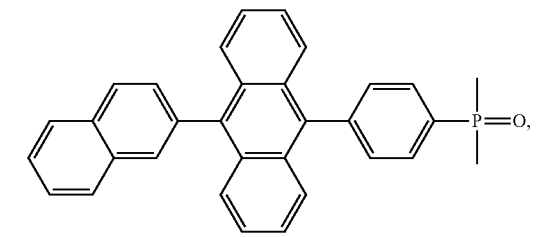
(Vw)
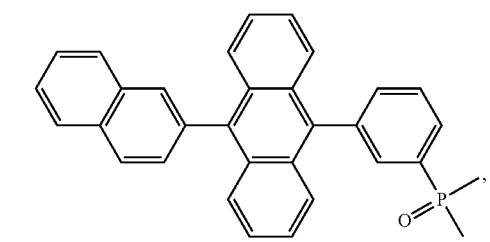
(Vx)
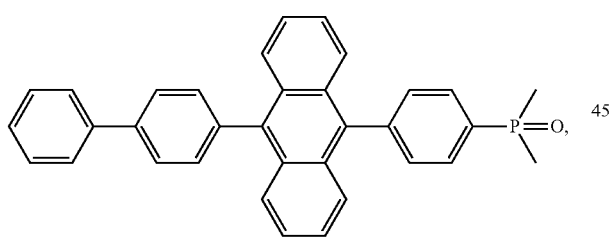
(Vy)
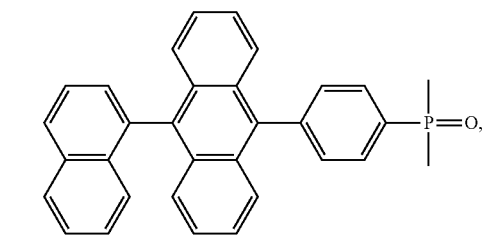
(Vz)
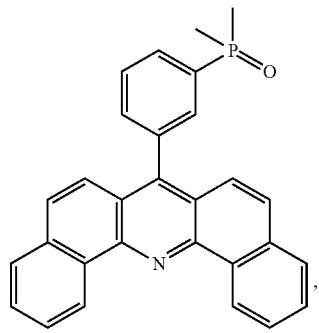
(Vaa)
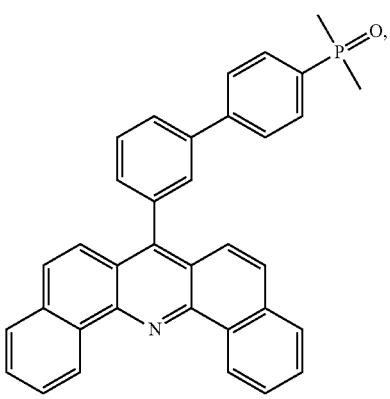
(Vab)
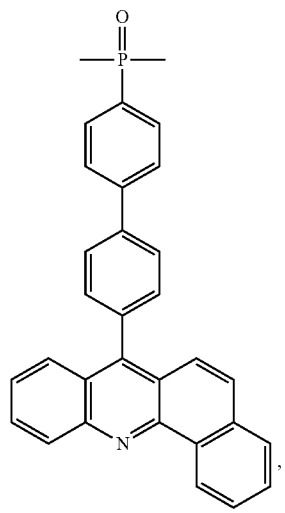
(Vac)
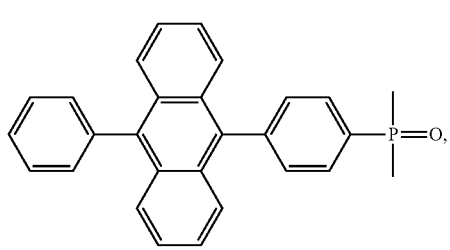

-continued (Vad)
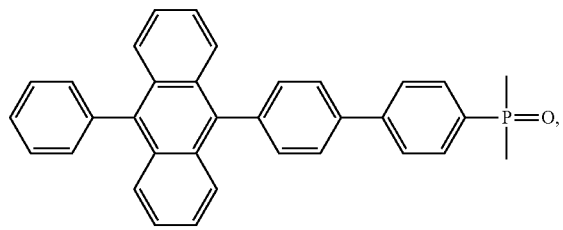

(Vae)
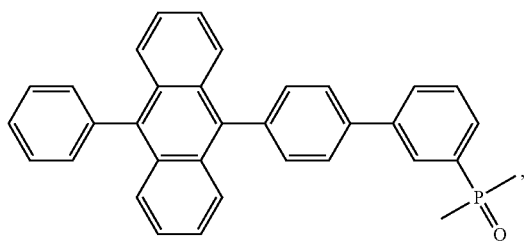

(Vaf)
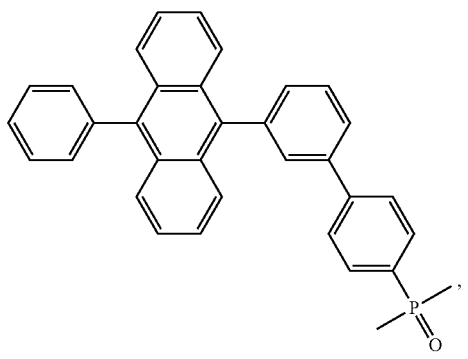

(Vag)
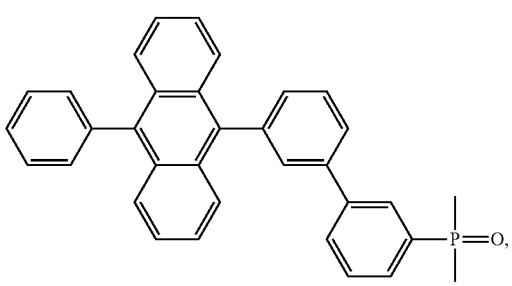

(Vah)
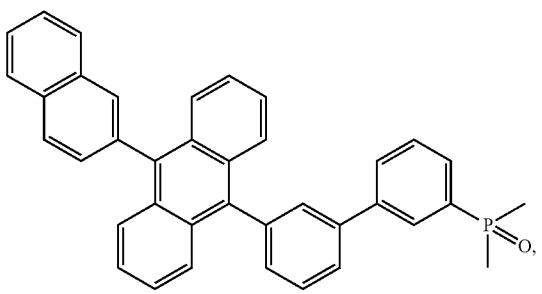

-continued (Vai)
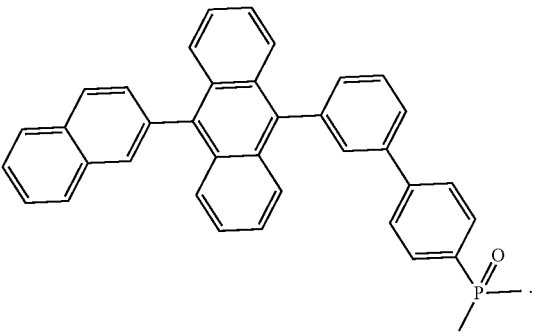

According to another embodiment of the electroluminescent device, wherein the at least one light emitting layer comprises an emitter host compound comprising 4, 5, 6, 7, 8, 9, 10, 11 or 12 aromatic rings, which are independently selected from carbocyclic rings and heterocyclic rings, preferably at least three aromatic rings in the emitter host compound are condensed aromatic rings, and further preferred at least one aromatic ring of the emitter host compound is a five- or six-membered heterocyclic ring, and in addition preferred at least one aromatic ring is a five-membered heterocyclic ring containing one atom selected from N, 0 and S, preferably a furan ring.

According to another embodiment of the electroluminescent device, wherein the at least one first hole transport layer comprises an electrical p-dopant, which is selected from the group comprising:
a) organic compounds comprising at least one, preferably at least two, more preferably at least three, most preferably at least four electron withdrawing group(s) selected from:
 (i) perhalogenated alkyl, wherein the halogen in the perhalogenated alkyl is preferably selected from F and Cl, more preferably, the perhalogenated alkyl is a perfluoroalkyl,
 (ii) carbonyl group,
 (iii) sulfonyl group,
 (iv) nitrile group and
 (v) nitro group;
b) metal oxides, metal salts and metal complexes, wherein the metal in the metal oxide, metal salt and/or the metal complex is preferably present in its maximum oxidation state.

According to another embodiment of the electroluminescent device, wherein the at least one first hole transport layer comprises an electrical p-dopant and at least one first hole transport matrix compound.

According to another embodiment of the electroluminescent device, wherein the at least one first hole transport matrix compound is selected from the group comprising an organic conjugated aromatic system with at least 6 delocalized electrons.

According to another embodiment of the electroluminescent device, wherein the at least one first electron transport layer comprises a redox n-dopant, which is selected from the group comprising:
a) elemental metals, preferably selected from alkali metals, alkaline earth metals and rare earth metals; further preferred selected from Li, Na, K, Rb, Cs, Mg, Ca, Sr, Ba, Sm, Eu, Yb; more preferred selected from Li, Na, Cs, Mg, Sr, Yb; even more preferred selected from Li, Na, Mg, Yb; most preferred selected from Li and/or Yb;

b) organic radicals, preferably selected from diazolyl radicals, oxazolyl radicals and thiazolyl radicals;
c) transition metal complexes, wherein the transition metal is selected from $3^{rd}$, $4^{th}$, $5^{th}$, $6^{th}$, $7^{th}$, $8^{th}$, $9^{th}$ or $10^{th}$ group of the Periodic Table and is in oxidation state (–I), (0), (I) or (II), preferably, the transition metal complex is electrically neutral.

According to another embodiment of the electroluminescent device, wherein the at least one first electron transport aromatic matrix compound is selected from the group comprising an organic conjugated aromatic system with at least 6 delocalized electrons.

According to another embodiment of the electroluminescent device:
for the at least one light emitting layer:
  the emitter host compound comprises 4, 5, 6, 7, 8, 9, 10, 11 or 12 aromatic rings, which are independently selected from carbocyclic rings and heterocyclic rings, preferably at least three aromatic rings in the emitter host compound are condensed aromatic rings, and further preferred at least one aromatic ring of the emitter host compound is a five- or six-membered heterocyclic ring, and in addition preferred at least one aromatic ring is a five-membered heterocyclic ring containing one atom selected from N, O and S, preferably a furan ring; and
for the at least one first hole transport layer:
  the electrical p-dopant is selected from the group comprising:
a) organic compounds comprising at least one, preferably at least two, more preferably at least three, most preferably at least four electron withdrawing group(s) selected from:
(i) perhalogenated alkyl, wherein the halogen in the perhalogenated alkyl is preferably selected from F and Cl, more preferably, the perhalogenated alkyl is a perfluoroalkyl,
(ii) carbonyl group,
(iii) sulfonyl group,
(iv) nitrile group and
(v) nitro group;
b) metal oxides, metal salts and metal complexes, wherein the metal in the metal oxide, metal salt and/or the metal complex is preferably present in its maximum oxidation state; and
optional at least one first hole transport matrix compound is selected from the group comprising an organic conjugated aromatic system with at least 6 delocalized electrons;
for the at least one first electron transport layer:
  the redox n-dopant is selected from the group comprising:
a) elemental metals, preferably selected from alkali metals, alkaline earth metals and rare earth metals; further preferred selected from Li, Na, K, Rb, Cs, Mg, Ca, Sr, Ba, Sm, Eu, Yb; more preferred selected from Li, Na, Cs, Mg, Sr, Yb; even more preferred selected from Li, Na, Mg, Yb; most preferred selected from Li and/or Yb;
b) organic radicals, preferably selected from diazolyl radicals, oxazolyl radicals and thiazolyl radicals;
c) transition metal complexes, wherein the transition metal is selected from $3^{rd}$, $4^{th}$, $5^{th}$ $6^{th}$, $7^{rd}$, $8^{th}$, $9^{th}$ or $10^{th}$ group of the Periodic Table and is in oxidation state (–I), (0), (I) or (II), preferably, the transition metal complex is electrically neutral;
  the at least one first electron transport aromatic matrix compound is selected from the group comprising an organic conjugated aromatic system with at least 6 delocalized electrons.

According to another embodiment of the electroluminescent device, wherein the emitter host compound has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.3 Debye to about ≤1.8 Debye, preferably in the range from about ≥0.5 Debye to about ≤1.6 Debye, even more preferred in the range from about ≥0.6 Debye to about ≤1.4 Debye, and most preferred in the range from about ≥0.7 Debye to about ≤1.3 Debye.

According to another embodiment of the electroluminescent device, wherein the first electron transport aromatic matrix compound is an organic conjugated aromatic system with at least 6 delocalized electrons comprising a phosphine oxide group.

According to another embodiment of the electroluminescent device, wherein
  the emitter host compound has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.3 Debye to about ≤1.8 Debye, preferably in the range from about ≥0.5 Debye to about ≤1.6 Debye, even more preferred in the range from about ≥0.6 Debye to about ≤1.4 Debye, and most preferred in the range from about ≥0.7 Debye to about ≤1.3 Debye; and
  the first electron transport aromatic matrix compound is an organic conjugated aromatic system with at least 6 delocalized electrons comprising a phosphine oxide group or the first electron transport aromatic matrix compound is a compound according to the chemical formula 2, and preferably the first electron transport aromatic matrix compound is an organic conjugated aromatic system with at least 6 delocalized electrons comprising a phosphine oxide group.

According to another embodiment of the electroluminescent device, wherein the emitter host compound is an anthracene compound represented by the chemical Formula 1:

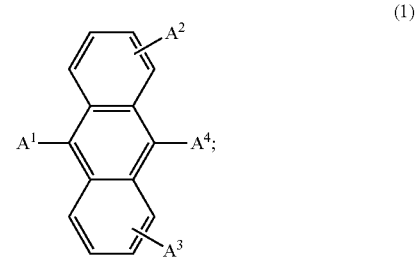

(1)

wherein
$A^1$ is selected from the group comprising a substituted or unsubstituted $C_6$-$C_{60}$ aryl or $C_6$-$C_{60}$ heteroaryl;
$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;

$A^4$ is selected from the group comprising a substituted or unsubstituted $C_6$-$C_{60}$ aryl or $C_6$-$C_{60}$ heteroaryl, preferably a $C_6$-$C_{60}$ heteroaryl.

According to another embodiment of the electroluminescent device, wherein the first electron transport aromatic matrix compound having the chemical formula 2:

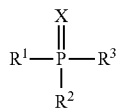

Formula (2)

wherein
X is selected from O, S, Se;
$R^1$ and $R^2$ are independently selected from $C_1$ to $C_{12}$ alkyl, $C_6$ to $C_{20}$ aryl and $C_5$ to $C_{20}$ heteroaryl;
$R^3$ is selected from formula (2A),

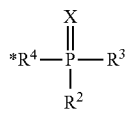

Formula (2A)

or formula (2B)

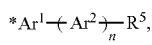

Formula (2B)

wherein
* marks the position in the respective $R^4$ or $Ar^1$ group for binding the $R^4$ or $Ar^1$ to the phosphorus atom in formula (I);
$R^4$ is selected from $C_1$ to $C_8$ alkyl, $C_6$ to $C_{20}$ aryl and $C_5$ to $C_{20}$ heteroaryl;
$Ar^1$ is selected from $C_6$ to $C_{20}$ aryl and $C_5$ to $C_{20}$ heteroaryl;
$Ar^2$ is selected from $C_{18}$ to $C_{40}$ aryl and $C_{10}$ to $C_{oo}$ heteroaryl;
$R^5$ is selected from H, $C_1$ to $C_{12}$ alkyl, $C_6$ to $C_{20}$ aryl and $C_5$ to $C_{20}$ heteroaryl
n is selected from 0, 1, or 2.

According to another embodiment of the electroluminescent device, wherein
the emitter host compound is an anthracene compound represented by the chemical Formula 1:

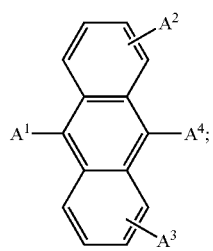

(1)

wherein
$A^1$ is selected from the group comprising a substituted or unsubstituted $C_6$-$C_{60}$ aryl or $C_6$-$C_{60}$ heteroaryl;

$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
$A^4$ is selected from the group comprising a substituted or unsubstituted $C_6$-$C_{60}$ aryl or $C_6$-$C_{60}$ heteroaryl, preferably a $C_6$-$C_{60}$ heteroaryl; and
the first electron transport aromatic matrix compound having the chemical formula 2:

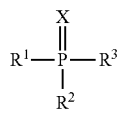

Formula (2)

wherein
X is selected from O, S, Se;
$R^1$ and $R^2$ are independently selected from $C_1$ to $C_{12}$ alkyl, $C_6$ to $C_{20}$ aryl and $C_5$ to $C_{20}$ heteroaryl;
$R^3$ is selected from formula (2A),

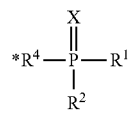

Formula (2A)

or formula (2B)

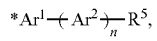

Formula (2B)

wherein
* marks the position in the respective $R^4$ or $Ar^1$ group for binding the $R^4$ or $Ar^1$ to the phosphorus atom in formula (I);
$R^4$ is selected from $C_1$ to $C_8$ alkyl, $C_6$ to $C_{20}$ aryl and $C_5$ to $C_{20}$ heteroaryl;
$Ar^1$ is selected from $C_6$ to $C_{20}$ aryl and $C_5$ to $C_{20}$ heteroaryl;
$Ar^2$ is selected from $C_{18}$ to $C_{40}$ aryl and $C_{10}$ to $C_{oo}$ heteroaryl;
$R^5$ is selected from H, $C_1$ to $C_{12}$ alkyl, $C_6$ to $C_{20}$ aryl and $C_5$ to $C_{20}$ heteroaryl
n is selected from 0, 1, or 2.

According to another embodiment of the electroluminescent device, wherein in chemical Formula 1 the hetero atom of the $C_6$-$C_{60}$ heteroaryl is selected from the group comprising N, O and/or S, preferably 0.

According to another embodiment of the electroluminescent device, wherein in chemical Formula 2 at least one or all of $R^1$, $R^2$, $R^5$, $Ar^1$ and $Ar^2$ are substituted with $C_1$ to $C_{12}$ alkyl and $C_1$ to $C_{12}$ heteroalkyl groups.

According to another embodiment of the electroluminescent device, wherein
in chemical Formula 1 the hetero atom of the $C_6$-$C_{60}$ heteroaryl is selected from the group comprising N, O and/or S, preferably 0; and
in chemical Formula 2 at least one or all of $R^1$, $R^2$, $R^5$, $Ar^1$ and $Ar^2$ are substituted with $C_1$ to $C_{12}$ alkyl and $C_1$ to $C_{12}$ heteroalkyl groups.

According to another embodiment of the electroluminescent device, wherein in chemical Formula 1:

the $C_6$-$C_{60}$ heteroaryl comprises at least one five-membered ring, preferably the five membered ring is a furan or thiophene ring; or the $C_6$-$C_{60}$ aryl comprises an anthracene or benzoanthracene; or the $C_6$-$C_{60}$ heteroaryl comprises a benzofuran, dibenzofuran, benzo-naphtofuran or dinaphtofuran.

According to another embodiment of the electroluminescent device, wherein in chemical Formula 2, two substituents selected from $R^1$, $R^2$ and $R^3$ form with the phosphorus atom a 7-membered phosphepine ring.

According to another embodiment of the electroluminescent device, wherein in chemical Formula 1:

the $C_6$-$C_{60}$ heteroaryl comprises at least one five-membered ring, preferably the five membered ring is a furan or thiophene ring; or the $C_6$-$C_{60}$ aryl comprises an anthracene or benzoanthracene; or the $C_6$-$C_{60}$ heteroaryl comprises a benzofuran, dibenzofuran, benzo-naphtofuran and dinaphtofuran; and in chemical Formula 2:

two substituents selected from $R^1$, $R^2$ and $R^3$ form with the phosphorus atom a 7-membered phosphepine ring.

According to another embodiment of the electroluminescent device, wherein in chemical Formula 1:

$A^4$ has the following formulas (IIa) to (IIi):

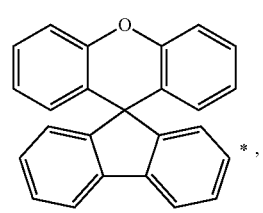

(IIa)

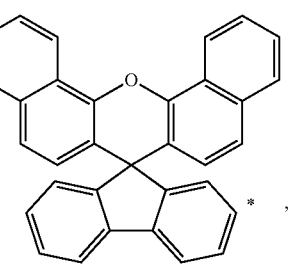

(IIb)

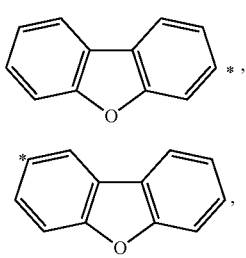

(IIc)

(IId)

-continued

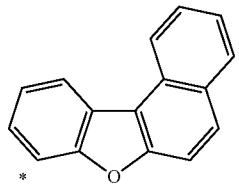

(IIe)

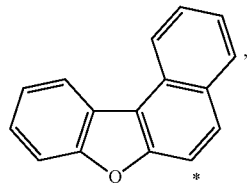

(IIf)

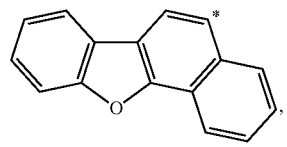

(IIg)

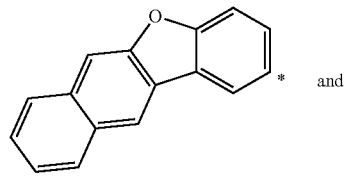

(IIh) and

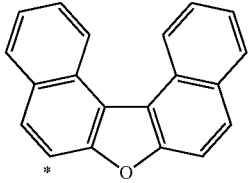

(IIi)

wherein * marks the binding position for the respective $A^4$ group to the anthracene compound.

According to another embodiment of the electroluminescent device, wherein the anthracene compound according to chemical Formula I is selected from the group of Formula B1 to B7:

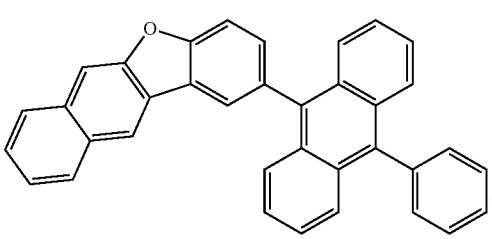

(B1)

(B2)
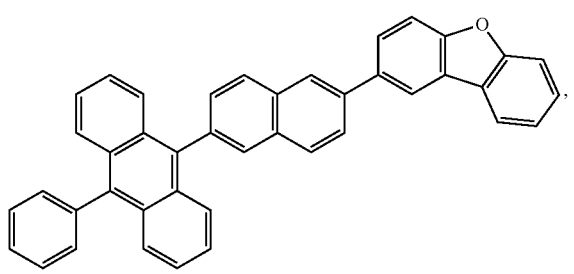
(B3)
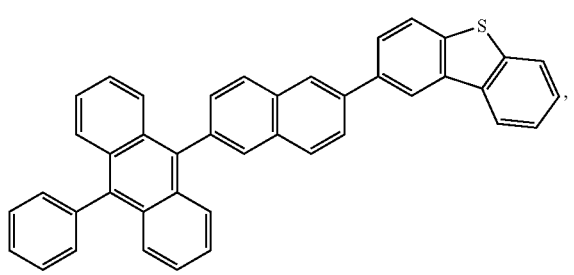
(B4)
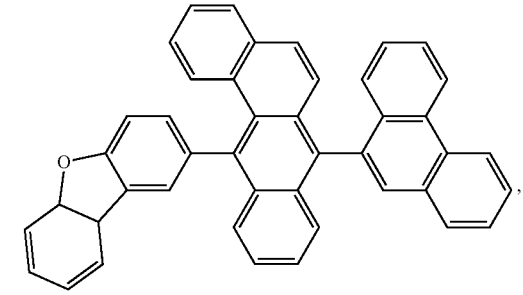
(B5)
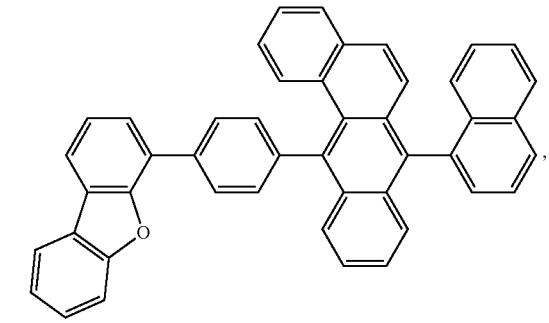
(B6)
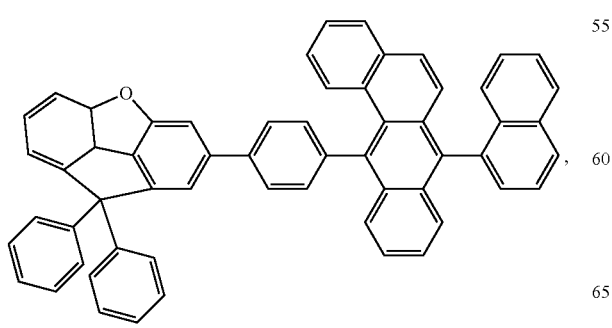
(B7)
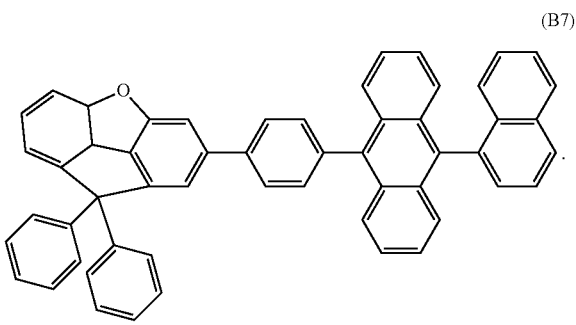 [SMILES: C1=CC2Oc3cc(-c4ccc(-c5c6ccccc6c(-c6cccc7ccccc67)c6ccccc56)cc4)cc4c3C2C(=C1)C4(c1ccccc1)c1ccccc1]
According to another embodiment of the electroluminescent device, wherein the first electron transport aromatic matrix compound according to chemical Formula 2 is selected from the group of Formula Va to Vai:
Formula Va to Ve:
(Va)
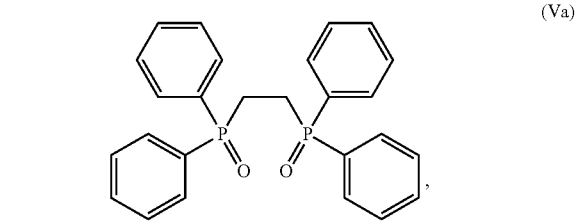
(Vb)
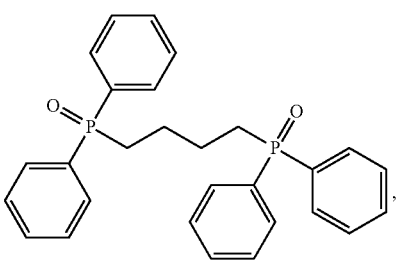
(Vc)
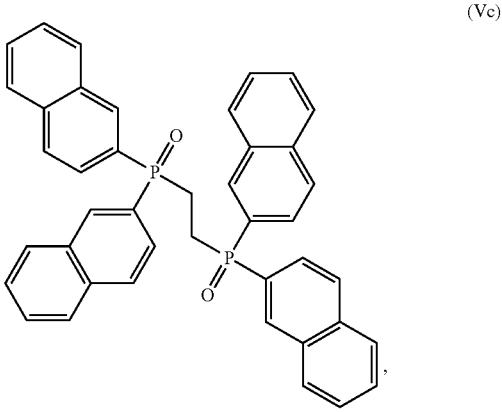

(Vd)
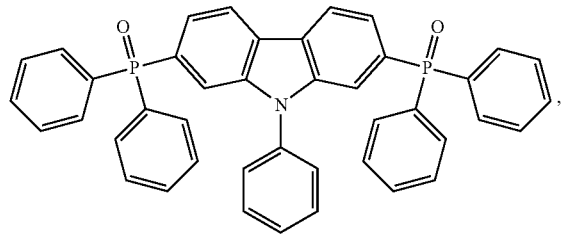
(Ve)
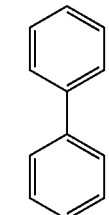
or
Formula Vf to Vq:
(Vf)
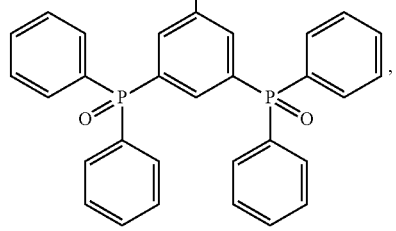
(Vg)
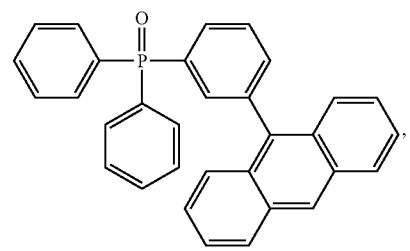
(Vh)
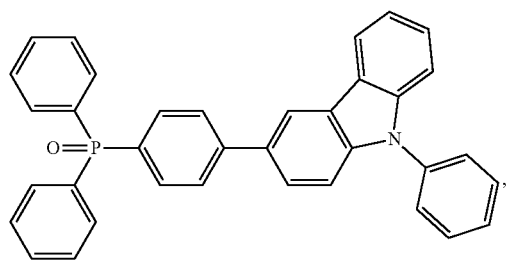
(Vi)
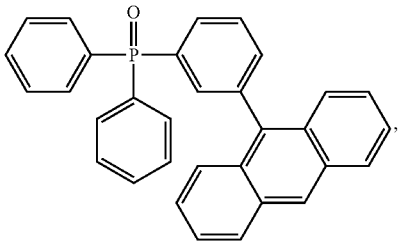
(Vj)
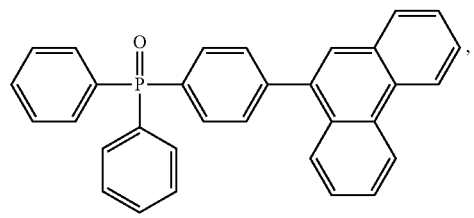
(Vk)
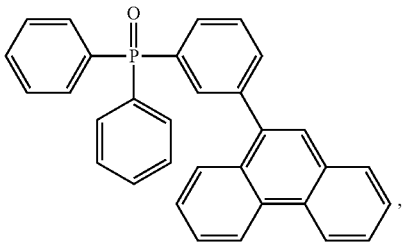
(Vl)
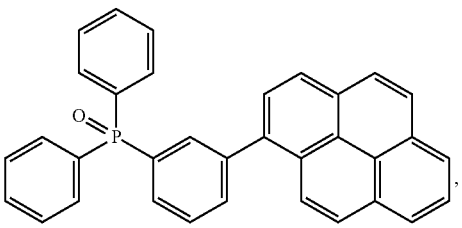
(Vm)
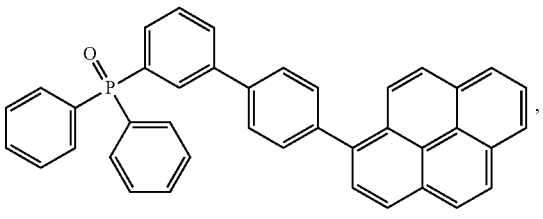
(Vn)
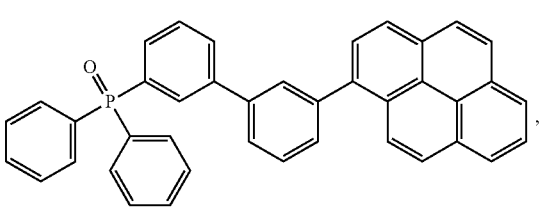

-continued
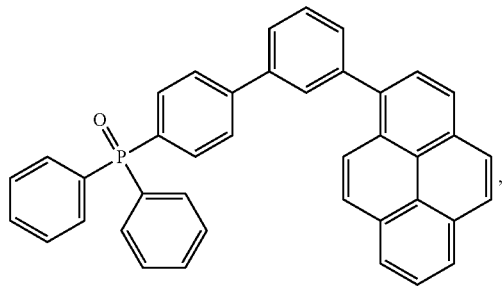
(Vo)
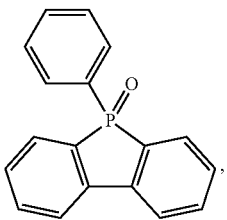
(Vt)
Formula Vu to Vai:
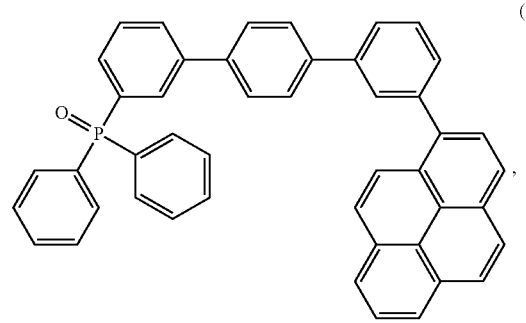
(Vp)
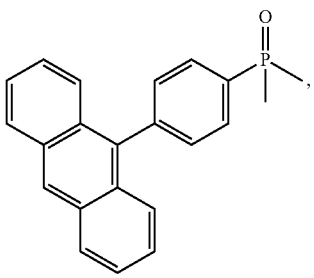
(Vu)
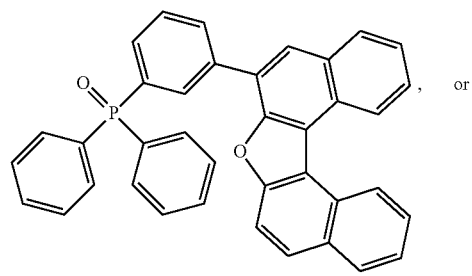
(Vq), or
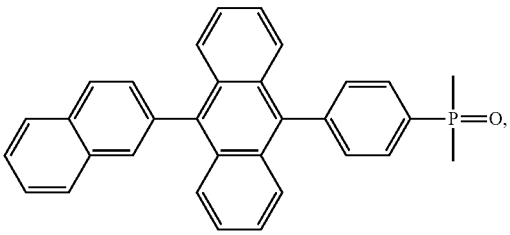
(Vv)
Formula Vr to Vt:
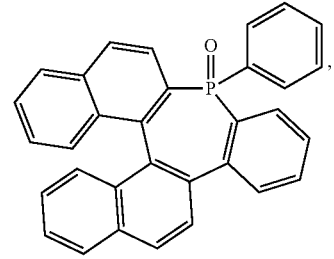
(Vr)
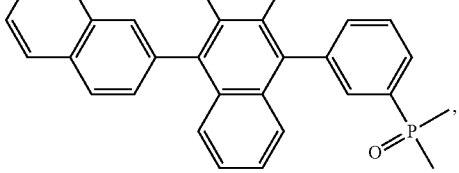
(Vw)
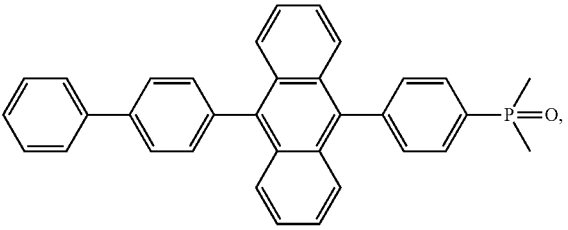
(Vx)
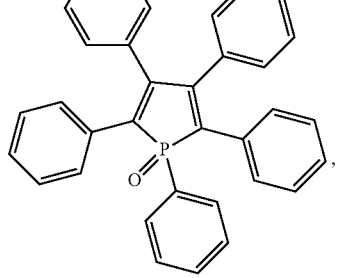
(Vs)
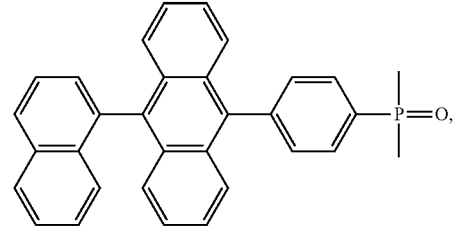
(Vy)

(Vz)
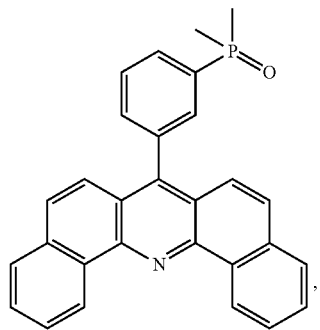
(Vaa)
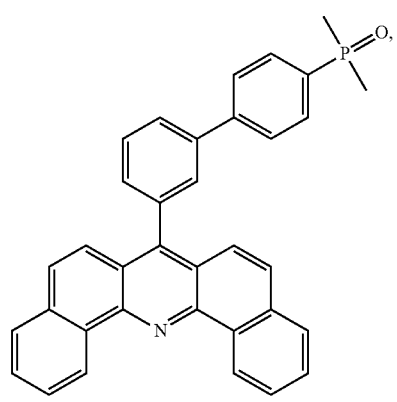
(Vab)
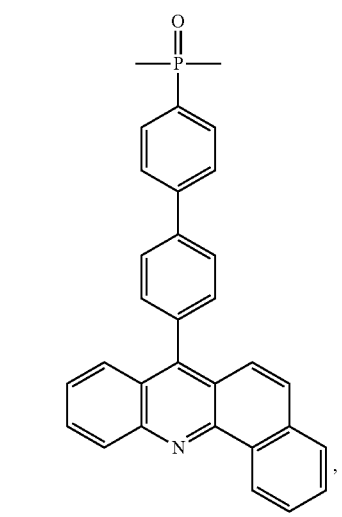
(Vac)
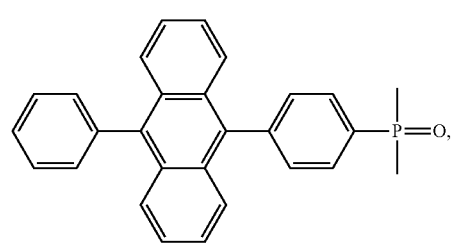
(Vad)
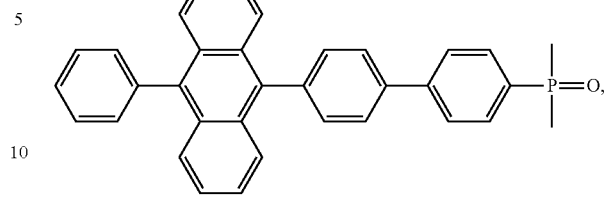
(Vae)
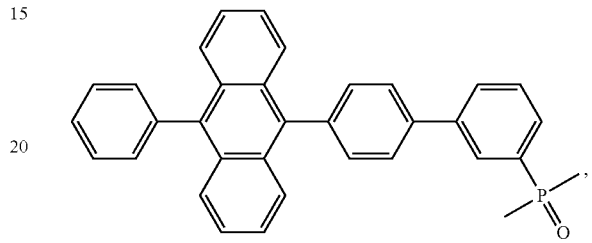
(Vaf)
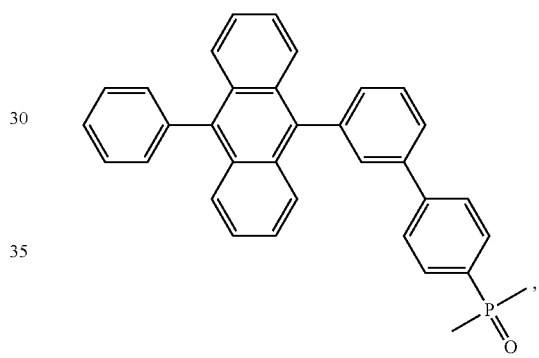
(Vag)
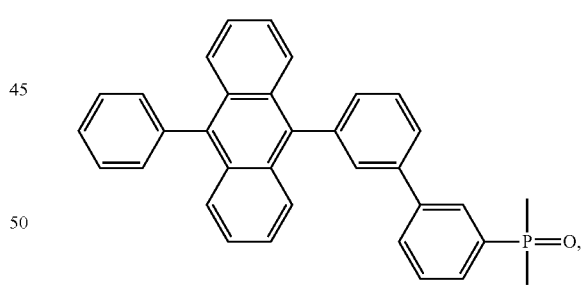
(Vah)
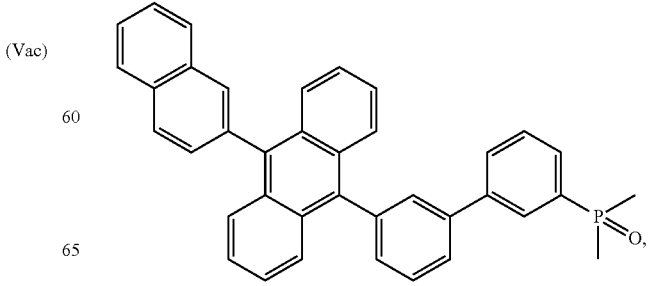

(Vai)
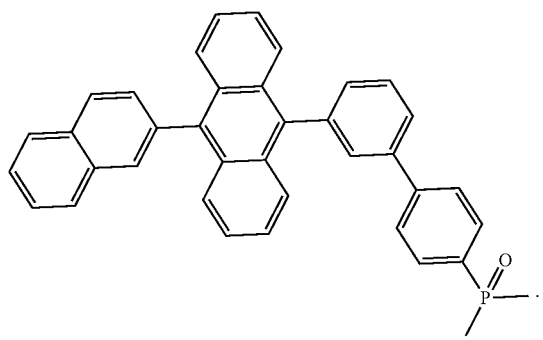
According to another embodiment of the electroluminescent device, wherein
the anthracene compound according to chemical Formula 1 is selected from the group of Formrula B1 to B7:
(B1)
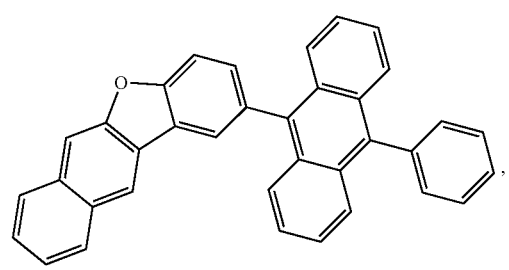
(B2)
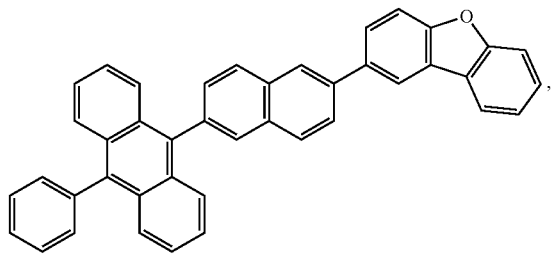
(B3)
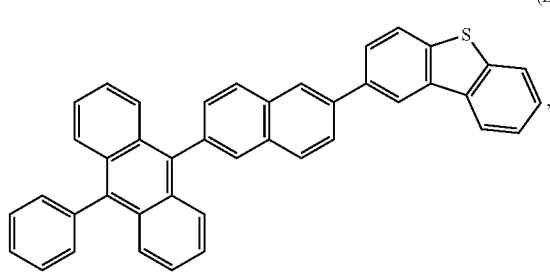
(B4)
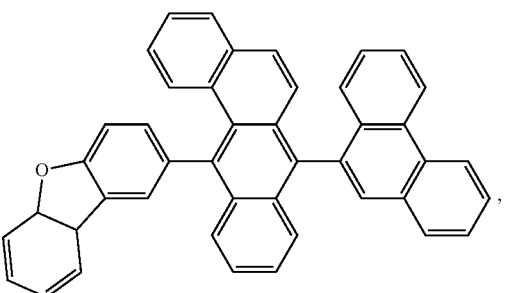
(B5)
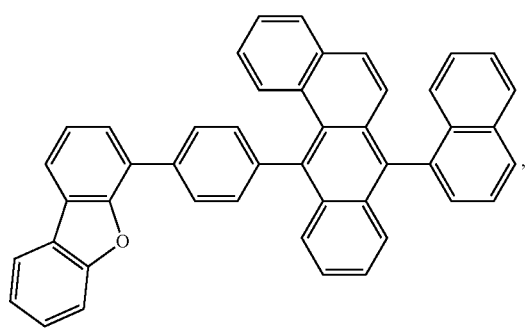
(B6)
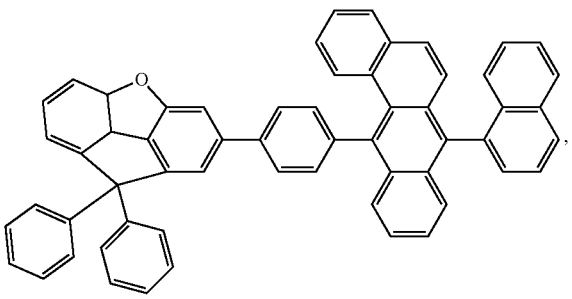
(B7)
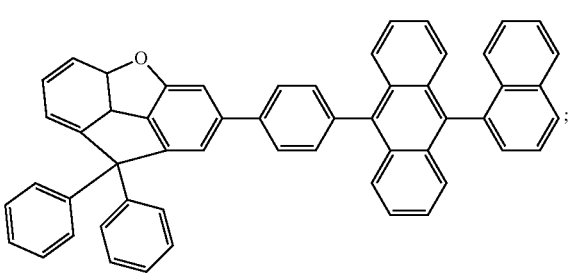
and
the first electron transport aromatic matrix compound according to chemical Formula 2 is selected from the group of Formula Va to Vai:

Formula Va to Ve:
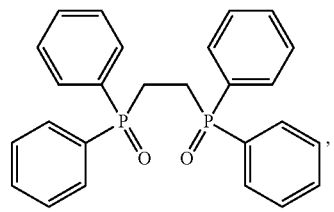
(Va)
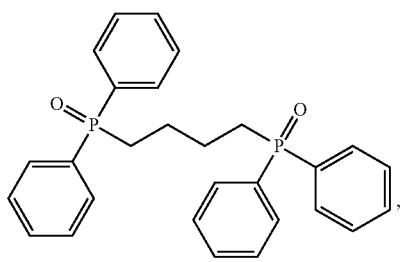
(Vb)
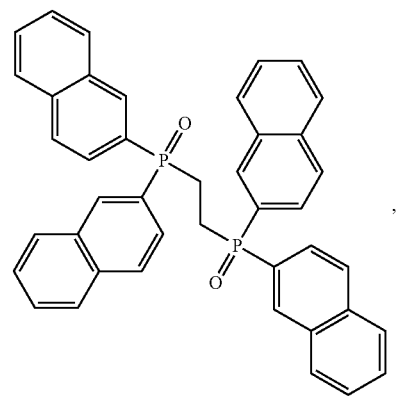
(Vc)
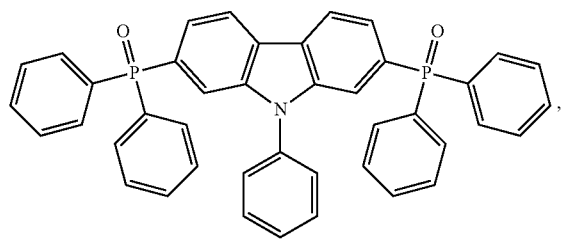
(Vd)
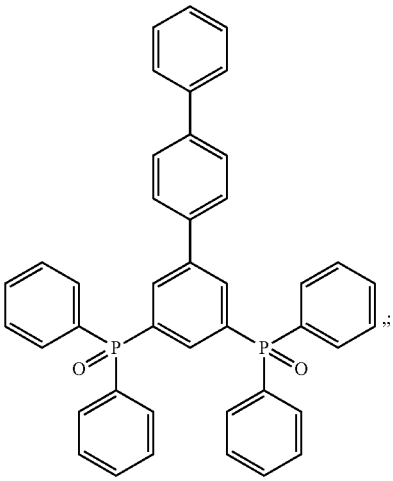
(Ve)
or
Formula Vf to Vq:
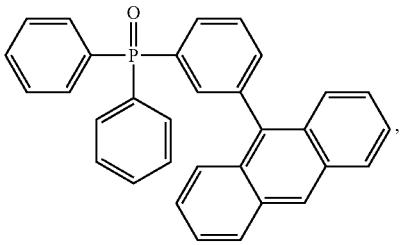
(Vf)
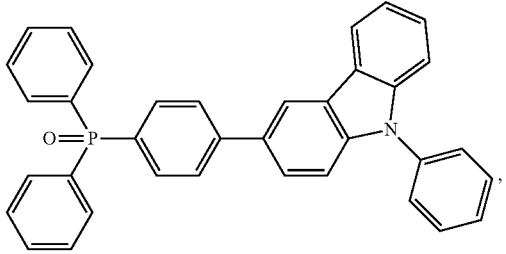
(Vg)
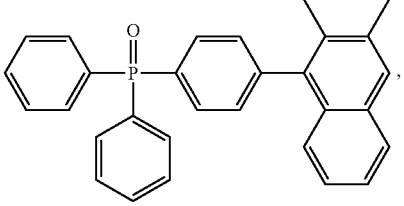
(Vh)
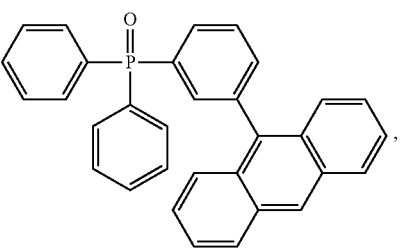
(Vi)

(Vj) 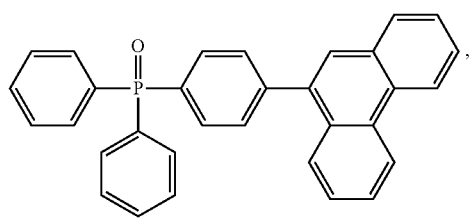
(Vk) 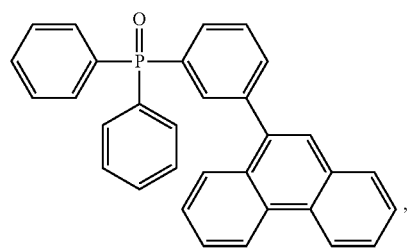
(Vl) 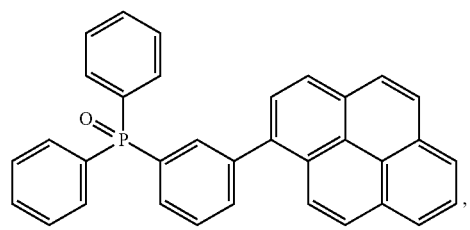
(Vm) 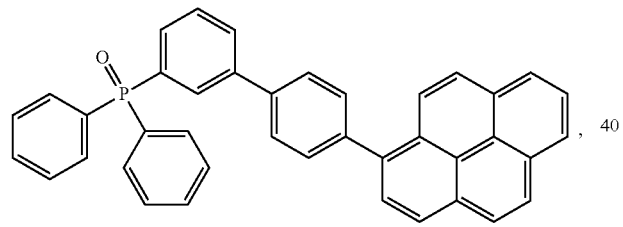
(Vn) 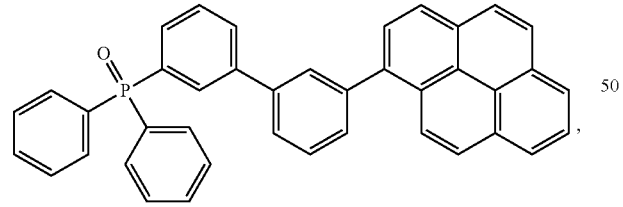
(Vo) 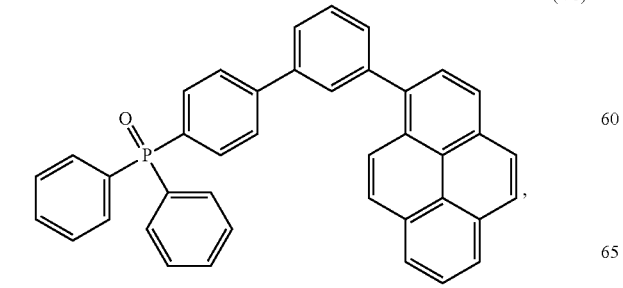
(Vp) 
(Vq) 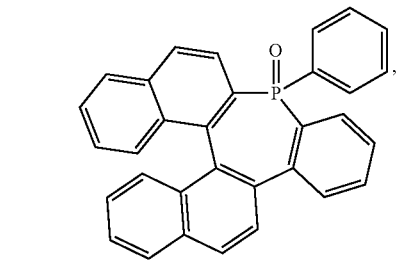, or .
Formula Vr to Vt:
(Vr) 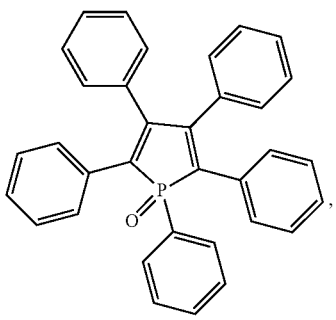
(Vs) 
(Vt) 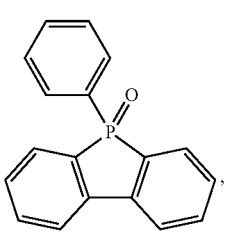

Formula Vu to Vai:
(Vu)
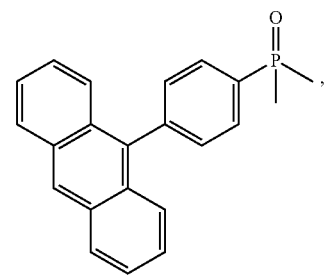
(Vv)
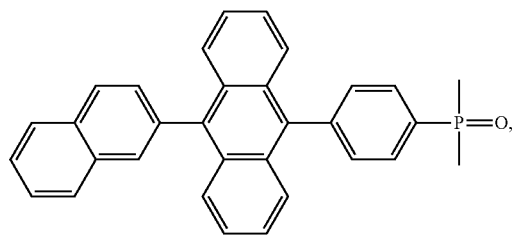
(Vw)
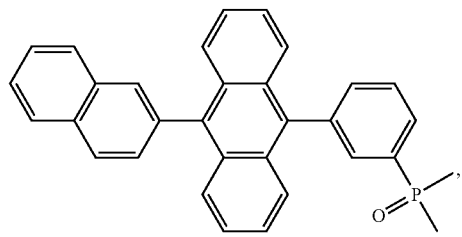
(Vx)
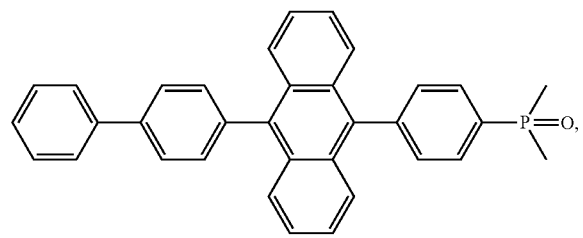
(Vy)
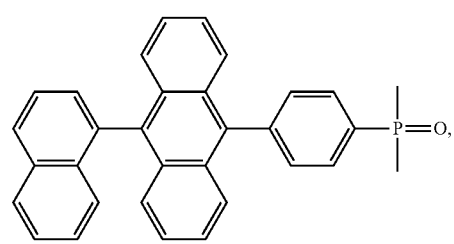
(Vz)
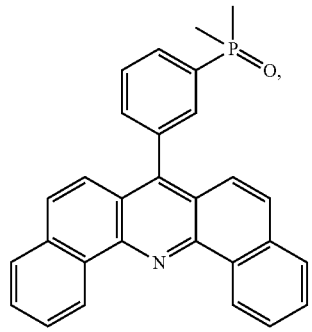
(Vaa)
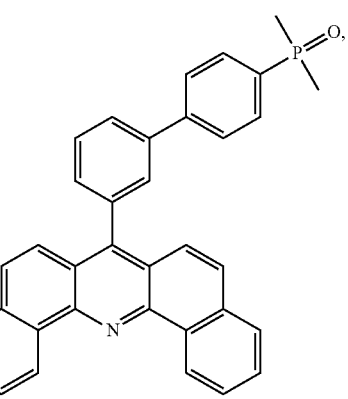
(Vab)
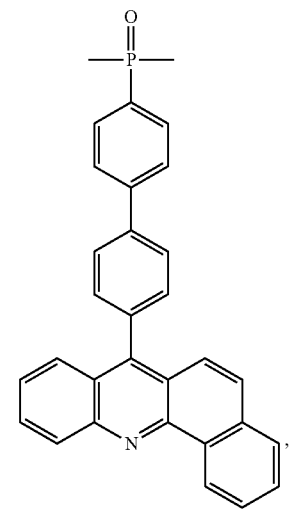
(Vac)
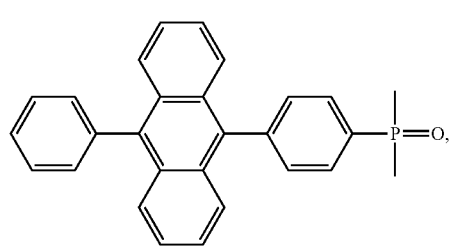

(Vad)
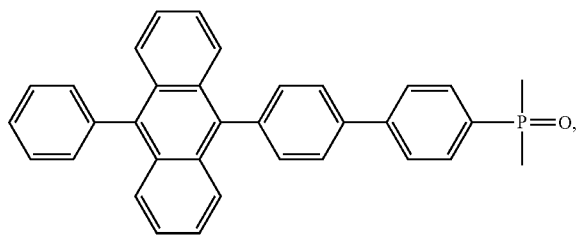

(Vae)
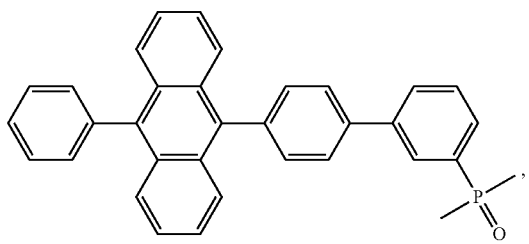

(Vaf)
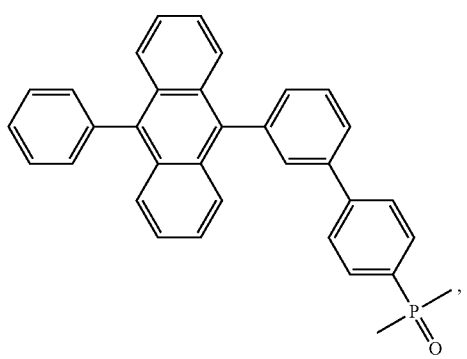

(Vag)
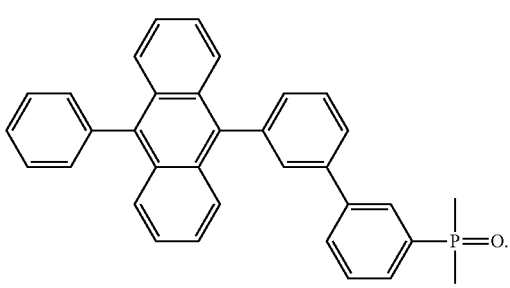

(Vah)
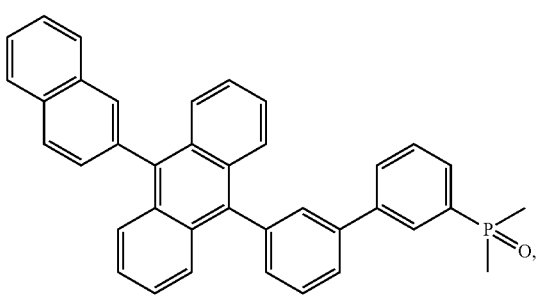

(Vai)
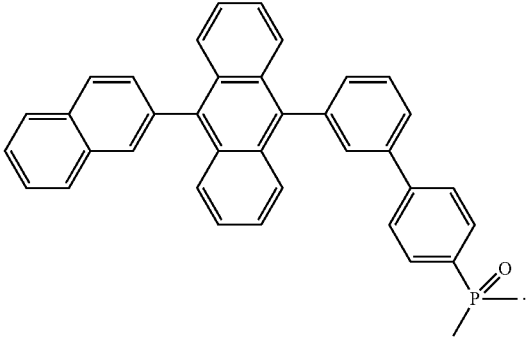

According to another embodiment of the electroluminescent device, wherein the device comprises in addition a second electron transport layer comprising at least one second electron transport matrix compound, comprising preferably a conjugated system of at least six delocalized electrons, and the second electron transport layer is arranged between the first electron transport layer and the light emitting layer, preferably the second electron transport layer is adjacent arranged to the first electron transport layer and/or to the light emitting layer.

According to another embodiment of the electroluminescent device, wherein the second electron transport compound is an aromatic compound having a redox potential, measured by the standard procedure, as described below, in the range from −2.2 to −2.4 V, against ferrocene/ferrocenium redox couple as a reference.

According to another embodiment of the electroluminescent device, wherein the second electron transport aromatic matrix compound has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from 0.1 Debye to 5.0 Debye, preferably from 0.5 Debye to 4.5 Debye, more preferably from 1.0 Debye to 4.0 Debye, even more preferably from 1.2 Debye to 3.8 Debye, and most preferably from 1.5 Debye to 3.5 Debye.

The present invention is further described in more detail.

Electron Transport Region

An electron transport region of the stack of organic layers may be disposed on the emission layer.

The electron transport region of the stack of organic layers includes at least the first electron transport layer and optional a second electron transport layer. The electron transport region of the stack of organic layers may further include an electron injection layer.

For example, the electron transport region of the stack of organic layers may have a structure of the first electron transport layer/electron injection or as an alternative a first electron transport layer/second electron transport layer/electron injection layer but is not limited thereto. For example, an organic light emitting diode according to an embodiment of the present invention includes at least one electron transport layer, and in this case, the electron transport layer comprising the electrical p-dopant and the at least one first electron transport matrix compound is defined as the first electron transport layer. In another embodiment, the organic light emitting diode may comprise at least two electron transport layers in the electron transport region of the stack of organic layers, and in this case, the electron transport layer contacting the emission layer is defined as the second electron transport layer.

The electron transport layer may include one or two or more different electron transport matrix compounds.

The thickness of the first electron transport layer may be from about 2 nm to about 100 nm, for example about 3 nm to about 30 nm. When the thickness of the first electron transport layer is within these ranges, the first electron transport layer may have improved electron transport auxiliary ability without a substantial increase in driving voltage.

A thickness of the optional second electron transport layer may be about 10 nm to about 100 nm, for example about 15 nm to about 50 nm. When the thickness of the electron transport layer is within these ranges, the electron transport layer may have satisfactory electron transporting ability without a substantial increase in driving voltage.

First Electron Transport Matrix Compound

First electron transport matrix is not particularly limited. Similarly as other materials which are in the inventive device comprised outside the emitting layer, the second electron transport matrix may not emit light.

According to one embodiment, the first electron transport matrix can be an organic compound, an organometallic compound, or a metal complex.

According to one embodiment, the first electron transport matrix may be a covalent compound comprising a conjugated system of at least 6 delocalized electrons. Under a covalent material in a broadest possible sense, it might be also understood a material, wherein at least 50% of all chemical bonds are covalent bonds, wherein coordination bonds are also considered as covalent bonds. In the present application, the term encompasses in the broadest sense all usual electron transport matrices which are predominantly selected from organic compounds but also e.g. from compounds comprising structural moieties which do not comprise carbon, for example substituted 2,4,6-tribora-1,3,5 triazines, or from metal complexes, for example aluminium tris(8-hydroxyquinolinolate).

The molecular covalent materials can comprise low molecular weight compounds which may be, preferably, stable enough to be processable by vacuum thermal evaporation (VTE). Alternatively, covalent materials can comprise polymeric covalent compounds, preferably, compounds soluble in a solvent and thus processable in form of a solution. It is to be understood that a polymeric substantially covalent material may be crosslinked to form an infinite irregular network, however, it is supposed that such crosslinked polymeric substantially covalent matrix compound still comprises both skeletal as well as peripheral atoms. Skeletal atoms of the covalent compound are covalently bound to at least two neighbour atoms. Other atoms of the covalent compound are peripheral atoms which are covalently bound with a single neighbour atom. Inorganic infinite crystals or fully crosslinked networks having partly covalent bonding but substantially lacking peripheral atoms, like silicon, germanium, gallium arsenide, indium phosphide, zinc sulfide, silicate glass etc are not considered as covalent matrices in the sense of present application, because such fully crosslinked covalent materials comprise peripheral atoms only on the surface of the phase formed by such material. A compound comprising cations and anions is still considered as covalent, if at least the cation or at least the anion comprises at least ten covalently bound atoms.

Preferred examples of covalent first electron transport matrix compounds are organic compounds, consisting predominantly from covalently bound C, H, O, N, S, which may optionally comprise also covalently bound B, P, As, Se. In one embodiment, the first electron transport matrix compound lacks metal atoms and majority of its skeletal atoms is selected from C, O, S, N.

In another embodiment, the first electron transport matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic or heteroaromatic ring adhering to the Hückel rule. Also preferably, the first electron transport matrix compound may comprise at least two aromatic or heteroaromatic rings which are either linked by a covalent bond or condensed.

In one of specific embodiments, the first electron transport matrix compound comprises a ring consisting of covalently bound atoms and at least one atom in the ring is phosphorus.

In a more preferred embodiment, the phosphorus-containing ring consisting of covalently bound atoms is a phosphepine ring.

In another preferred embodiment, the first electron transport compound comprises a phosphine oxide group. Also preferably, the s first electron transport matrix compound comprises a heterocyclic ring comprising at least one nitrogen atom. Examples of nitrogen containing heterocyclic compounds which are particularly advantageous as first electron transport matrix compound for the inventive device are matrices comprising, alone or in combination, pyridine structural moieties, diazine structural moieties, triazine structural moieties, quinoline structural moieties, benzoquinoline structural moieties, quinazoline structural moieties, acridine structural moieties, benzacridine structural moieties, dibenzacridine structural moieties, diazole structural moieties and benzodiazole structural moieties.

The first electron transport matrix compound may have a molecular weight (Mw) of ≥400 to ≤850 g/mol, preferably ≥450 to ≤830 g/mol. If the molecular weight is selected in this range, particularly reproducible evaporation and deposition can be achieved in vacuum at temperatures where good long-term stability is observed.

Preferably, the first electron transport matrix compound may be essentially non-emissive.

In another embodiment, the first electron transport matrix compound may have dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, higher than 2.3 Debye. It may be a preferred embodiment in combination with redox dopants selected from elemental metals.

According to a further aspect of the invention, the reduction potential of the first electron transport matrix compound, if measured under the same conditions by cyclic voltammetry against $Fc/Fc^+$ in tetrahydrofuran, may have a value which is less negative than the value obtained for triphenylphosphine oxide and more negative than the value obtained for tetrakis(quinoxalin-5-yloxy)zirconium.

Under these conditions the redox potential of triphenylphosphine oxide is about −3.06 V and the reduction potential of tetrakis(quinoxalin-5-yloxy)zirconium is about −1.78 V.

According to a further aspect of the invention, the redox potential of the first electron transport matrix compound, if measured under the same conditions by cyclic voltammetry against Fc/Fc+ in tetrahydrofuran, may have a value which is less negative than the respective value obtained for triphenylphosphine oxide, preferably less negative than the respective value for bis(4-(9H-carbazol-9-yl)phenyl)-(phenyl)phosphine oxide, more preferably less negative than the respective value for 3-([1,1'-biphenyl]-4-yl)-5-(4-(tert-butyl)phenyl)-4-phenyl-4H-1,2,4-triazole, even more preferably less negative than the respective value for pyrene, most preferably less negative than the respective value for 2,7-di-pyrenyl-9,9-spirobifluorene, also preferably less negative than the respective value for 4,7-diphenyl-1,10-phenanthroline, also preferably less negative than the respective value for 2,4,7,9-tetraphenyl-1,10-phenanthroline, also preferably less negative than the respective value for 7-([1,1'-biphenyl]-4-yl)dibenzo[c,h]acridine, also preferably less negative than the respective value for 2,4,6-triphenyltriazine, and still preferably less negative than the respective value for 2,4,6-tri(biphenyl-4-yl)-1,3,5-triazine.

According to a further aspect of the invention, the redox potential of the first electron transport matrix compound, if measured under the same conditions by cyclic voltammetry against Fc/Fc+ in tetrahydrofuran, may have the value which is more negative than the respective value obtained for tetrakis(quinoxalin-5-yloxy)zirconium, preferably more negative than the respective value for 4,4'-bis(4,6-diphenyl-1,3,5-triazin-2-yl)-1,1'-biphenyl, most preferably more negative than the respective value for 2,4,6-tri(biphenyl-4-yl)-1,3,5-triazine.

The redox potential can be determined by following standard method, using cyclic voltammetry with potentiostatic device Metrohm PGSTAT30 and software Metrohm Autolab GPES at room temperature. The redox potentials given at particular compounds are measured in an argon de-aerated, dry 0.1M THF solution of the tested substance, under argon atmosphere, with 0.1M tetrabutylammonium hexafluorophosphate supporting electrolyte, between platinum working electrodes and with an Ag/AgCl pseudo-standard electrode (Metrohm Silver rod electrode), consisting of a silver wire covered by silver chloride and immersed directly in the measured solution, with the scan rate 100 mV/s. The first run is done in the broadest range of the potential set on the working electrodes, and the range was then adjusted within subsequent runs appropriately. The final three runs are done with the addition of ferrocene (in 0.1M concentration) as the standard. The average of potentials corresponding to cathodic and anodic peak of the studied compound, after subtraction of the average of cathodic and anodic potentials observed for the standard Fc+/Fc redox couple, afford finally the values reported above. All studied compounds as well as the reported comparative compounds showed well-defined reversible electrochemical behaviour.

According to various embodiments of the electroluminescent device the first electron transport matrix compound can be selected from:

an anthracene compound substituted with aryl, heteroaryl or alkyl groups, e.g. 3-[3'-(10-phenyl-9-anthracenyl)[1,1'-biphenyl]-4-yl]-quinoline;

a benzimidazole compound substituted with aryl, heteroaryl or alkyl groups, preferably 2-(4-(9,10-di(naphthalen-2-yl)anthracene-2-yl)phenyl)-1-phenyl-1H-benzo[d]imidazole and/or 1-(4-(10-([1,1'-biphenyl]-4-yl)anthracen-9-yl)phenyl)-2-ethyl-1H-benzo[d]imidazole;

a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, phenyldi(pyren-1-yl)phosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide;

a phenanthroline compound substituted with aryl or heteroaryl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7-diphenyl-1,10-phenanthroline, 1,3-bis(9-phenyl-1,10-phenanthrolin-2-yl)benzene and/or 3,8-bis(6-phenyl-2-pyridinyl)-1,10-phenanthroline;

a quinazoline compound substituted with aryl or heteroaryl groups, preferably 9-phenyl-9'-(4-phenyl-2-quinazolinyl)-3,3'-bi-9H-carbazole;

a benzo[h]quinazoline compound substituted with aryl or heteroaryl groups, preferably 4-(2-naphthalenyl)-2-[4-(3-quinolinyl)phenyl]-benzo[h]quinazoline;

a pyrido[3,2-h]quinazoline compound substituted with aryl or heteroaryl groups, preferably 4-(naphthalen-1-yl)-2,7,9-triphenylpyrido[3,2-h]quinazoline;

a triazine compound substituted with aryl or heteroaryl groups, preferably 4,4'-bis(4,6-diphenyl-1,3,5-triazin-2-yl)biphenyl, 3-[4-(4,6-di-2-naphthalenyl-1,3,5-triazin-2-yl) phenyl]quinoline and/or 2-[3-(6'-methyl[2,2'-bipyridin]-5-yl)-5-(9-phenanthrenyl)phenyl]-4,6-diphenyl-1,3,5-triazine and/or an acridine compound substituted with aryl or heteroaryl groups, preferably 7-(naphthalen-2-yl)dibenzo[c,h]acridine.

According to various embodiments of the electroluminescent device a matrix compound for the first electron transport layer can be more preferred; whereby the matrix compound of the second electron transport layer preferably differs from the first electron transport layer, can be selected from a phosphine oxide compound substituted with aryl, heteroaryl or alkyl groups, preferably (3-(dibenzo[c,h]acridin-7-yl)phenyl)diphenylphosphine oxide, 3-phenyl-3H-benzo[b]dinaphtho[2,1-d: 1',2'-f]phosphepine-3-oxide, phenyldi(pyren-1-yl)phosphine oxide, bis(4-(anthracen-9-yl)phenyl)(phenyl)phosphine oxide, (3-(9,10-di(naphthalen-2-yl)anthracen-2-yl)phenyl)diphenylphosphine oxide, diphenyl(5-(pyren-1-yl)pyridin-2-yl)phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

Suitable matrix compounds that can be suitable used for the first electron transport layer are summarized in Table 1 below.

TABLE 1

Chemical structures of the first ETL-matrix compound that can be suitable used

| Compound | Name | Structure | Reference |
| --- | --- | --- | --- |
| MX 1 | 2-(4-(9,10-di(naphthalen-2-yl)anthracen-2-yl)phenyl)-1-phenyl-1H-benzo[d]imidazole | | U.S. Pat. No. 6,878,469 |
| MX 2 | 3-[3'-(10-phenyl-9-antharacenyl)[1,1'-biphenyl]-4-yl]-quinoline | | KR2011018195 |
| MX 3 | 1-(4-(10-([1,1'-biphenyl]-4-yl)antharacen-9-yl)phenyl)-2-ethyl-1H-benzo[d]imidazole | | WO2010134352 |
| MX 4 | (3'-(dibenzo[c,h]acridin-7-yl)-[1,1'-biphenyl]-4-yl)diphenylphosphine oxide | | EP 2395571, WO2013079217 |

TABLE 1-continued

Chemical structures of the first ETL-matrix compound that can be suitable used

| Compound | Name | Structure | Reference |
| --- | --- | --- | --- |
| MX 5 | (3-(9,10-di(naphthalen-2-yl)anthracen-2-yl)phenyl)diphenylphosphine oxide | | EP13187905.8 |
| MX 6 | bis(4-(anthracen-9-yl)phenyl)(phenyl)phosphine oxide | | EP13187905.8 |
| MX 7 | Phenyldi(pyren-1-yl)phosphine oxide | | JP4876333 |

TABLE 1-continued

Chemical structures of the first ETL-matrix compound that can be suitable used

| Compound | Name | Structure | Reference |
| --- | --- | --- | --- |
| MX 8 | Phenylbis(3-(pyren-1-yl)phenyl)phosphine oxide | | EP13187905.8 |
| MX 9 | diphenyl(4'-(pyren-1-yl)-[1,1'-biphenyl]-3-yl)phosphine oxide | | EP13187905.8 |
| MX 10 | diphenyl(5-(pyren-1-yl)pyridin-2-yl)phosphine oxide | | WO2014167020 |

TABLE 1-continued

Chemical structures of the first ETL-matrix compound that can be suitable used

| Compound | Name | Structure | Reference |
| --- | --- | --- | --- |
| MX 11 | (3-(dibenzo[c,h]acridin-7-yl)phenyl)diphenylphosphine oxide | | EP 2395571, WO2013079217 |
| Vr | 3-Phenyl-3H-benzo[b]dinaphtho[2,1-d:1',2'-f]phosphepine-3-oxide | | EP13199361.0 |
| MX 12 | (3-(10-(naphthalen-2-yl)anthracen-9-yl)phenyl)diphenylphosphine oxide | | WO2015052284 |
| MX 13 | 2,4,7,9-tetraphenyl-1,10-phenanthroline | | EP1786050 |

TABLE 1-continued

Chemical structures of the first ETL-matrix compound that can be suitable used

| Compound | Name | Structure | Reference |
| --- | --- | --- | --- |
| MX 14 | 4,7-diphenyl-2,9-di-p-tolyl-1,10-phenanthroline | | EP1786050 |
| MX 15 | 2,9-di(biphenyl)-4-yl)-4,7-diphenyl-1,10-phenanthroline | | EP1786050 |
| MX 16 | 1,3-bis(9-phenyl-1,10-phenanthrolin-2-yl)benzene | | JP2004281390 |
| MX 17 | 3,8-bis(6-phenyl-2-pyridinyl)-1,10-phenanthroline | | CN102372708 |

TABLE 1-continued

Chemical structures of the first ETL-matrix compound that can be suitable used

| Compound | Name | Structure | Reference |
| --- | --- | --- | --- |
| MX 18 | 9-phenyl-9'-(4-phenyl-2-quinazolinyl)-3,3'-bi-9H-carbazole | | KR2012102374 |
| MX 19 | 4-(2-naphthalenyl)-2-[4-(3-quinolinyl)phenyl]-benzo[h]quinazoline | | KR2014076522 |
| MX 20 | 4-(naphthalen-1-yl)-2,7,9-triphenylpyrido[3,2-h]quinazoline | | EP1970371 |

TABLE 1-continued

Chemical structures of the first ETL-matrix compound that can be suitable used

| Compound | Name | Structure | Reference |
| --- | --- | --- | --- |
| MX 21 | 4,4'-bis(4,6-diphenyl-1,3,5-triazine-2-yl)biphenyl | | U.S. Pat. No. 6,225,467 |
| MX 22 | 3-[4-(4,6-di-2-naphthalenyl-1,3,5-triazin-2-yl)phenyl]-quinoline | | US20110156013 |
| MX 23 | 2-[3-(6'-methyl[2,2'-bipyridin]-5-yl)-5-(9-phenanthrenyl)phenyl]-4,6-diphenyl-1,3,5-triazine | | WO2014171541 |

TABLE 1-continued

Chemical structures of the first ETL-matrix compound that can be suitable used

| Compound | Name | Structure | Reference |
|---|---|---|---|
| MX 24 | 7-(naphthalen-2-yl)dibenzo[c,h]acridine | | EP 2395571 |

According to various embodiments of the electroluminescent device, wherein the first electron transport layer comprises about ≤100 wt.-% to about ≥30 wt.-%, preferably ≤95 wt.-% to about ≥40 wt.-%, of a matrix compound, based on the total weight of the first electron transport layer.

Preferably, the first electron transport matrix compound may be essentially non-emissive.

Second Electron Transport Matrix

Second electron transport compound is not particularly limited. Similarly as other materials which are in the inventive device comprised outside the emitting layer, the second electron transport matrix may not emit light.

According to one embodiment, the second electron transport matrix compound can be an organic compound, an organometallic compound, or a metal complex.

Compounds listed as examples of the first electron transport matrix compound can be used also as the second electron transport matrix compound.

According to one embodiment, the device comprises in addition a second electron transport layer comprising at least one second electron transport matrix compound which is selected from covalent compounds comprising a conjugated system of at least 6 delocalized electrons, preferably from organic compounds comprising at least one aromatic ring, more preferably from organic compounds comprising at least two aromatic rings, even more preferably from organic compounds comprising at least three aromatic rings, most preferably from organic compounds comprising at least four aromatic rings; and the second electron transport layer is arranged between the first electron transport layer and the light emitting layer, preferably the second hole transport layer is formed of the second electron transport matrix compound, and further preferably the second electron transport layer is adjacent arranged to the first electron transport layer and/or to the light emitting layer.

According to one embodiment, the second electron transport matrix compound may be a covalent compound comprising a conjugated system of at least 6 delocalized electrons. In one embodiment, the dipole moment of the second electron transport matrix compound is selected ≥0.5 Debye and ≤4.5 Debye, preferably ≥1.0 Debye and ≤4.0 Debye, more preferably ≥1.5 Debye and ≤3.5 Debye.

According to a further aspect of the invention, the redox potential of the second electron matrix compound may be selected less negative than −2.35 V and more negative than −2.14 V, preferably less negative than −2.3 V and more negative than −2.16 V, more preferably less negative than −2.25 V and more negative than −2.16 V, when measured against Fc/Fc$^+$ in tetrahydrofuran.

Redox n-Dopant

Under redox n-dopant, it is understood a compound which, if embedded into an electron transport matrix, increases concentration of free electrons in comparison with the neat matrix under the same physical conditions measured by cyclic voltammetry against ferrocene/ferrocenium reference redox couple.

The redox n-dopant may not emit light under the operation condition of an electroluminescent device, for example an OLED. In one embodiment, the redox n-dopant is selected from an elemental metal, an electrically neutral metal complex and/or an electrically neutral organic radical.

The most practical benchmark for the strength of an n-dopant is the value of its redox potential. There is no particular limitation in terms how negative the value of the redox potential can be.

As redox potentials of usual electron transport matrices used in organic light emitting diodes are, if measured by cyclic voltammetry against ferrocene/ferrocenium reference redox couple, roughly in the range from about −1.8 V to about −3.1V; the practically applicable range of redox potentials for n-dopants which can effectively n-dope such matrices is in a slightly broader range, from about −1.7 V to about −3.3 V.

The measurement of redox potentials is practically performed for a corresponding redox couple consisting of the reduced and of the oxidized form of the same compound. In case that the redox n-dopant is an electrically neutral metal complex and/or an electrically neutral organic radical, the measurement of its redox potential is actually performed for the redox couple formed by (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

Preferably, the redox potential of the electrically neutral metal complex and/or of the electrically neutral organic radical may have a value which is more negative than −1.7 V, preferably more negative than −1.9 V, more preferably more negative than −2.1 V, even more preferably more negative than −2.3 V, most preferably more negative than −2.5 V, if measured by cyclic voltammetry against ferrocene/ferrocenium reference redox couple for a corresponding redox couple consisting of (i) the electrically neutral metal complex and its cation radical formed by an abstraction of one electron from the electrically neutral metal complex, or (ii) the electrically neutral organic radical and its cation formed by an abstraction of one electron from the electrically neutral organic radical.

In a preferred embodiment, the redox potential of the n-dopant is between the value which is about 0.5 V more positive and the value which is about 0.5 V more negative than the value of the reduction potential of the chosen electron transport matrix. Electrically neutral metal complexes suitable as redox n-dopants may be e.g. strongly reductive complexes of some transition metals in low oxidation state. Particularly strong redox n-dopants may be selected for example from Cr(II), Mo(II) and/or W(II) guanidinate complexes such as $W_2(hpp)_4$, as described in more detail in WO2005/086251.

Electrically neutral organic radicals suitable as redox n-dopants may be e.g. organic radicals created by supply of additional energy from their stable dimers, oligomers or polymers, as described in more detail in EP 1 837 926 B1, WO2007/107306, or WO2007/107356. Specific examples of such suitable radicals may be diazolyl radicals, oxazolyl radicals and/or thiazolyl radicals.

Under an elemental metal, it is understood a metal in a state of a neat metal, of a metal alloy, or in a state of free atoms or metal clusters. It is understood that metals deposited by vacuum thermal evaporation from a metallic phase, e.g. from a neat bulk metal, vaporize in their elemental form. It is further understood that if the vaporized elemental metal is deposited together with a covalent matrix, the metal atoms and/or clusters are embedded in the covalent matrix. In other words, it is understood that any metal doped covalent material prepared by vacuum thermal evaporation contains the metal at least partially in its elemental form.

For the use in consumer electronics, only metals containing stable nuclides or nuclides having very long halftime of radioactive decay might be applicable. As an acceptable level of nuclear stability, the nuclear stability of natural potassium can be taken.

In one embodiment, the n-dopant is selected from electropositive metals selected from alkali metals, alkaline earth metals, rare earth metals and metals of the first transition period Ti, V, Cr and Mn. Preferably, the n-dopant is selected from Li, Na, K, Rb, Cs, Mg, Ca, Sr, Ba, Sm, Eu, Tm, Yb; more preferably from Li, Na, K, Rb, Cs, Mg and Yb, even more preferably from Li, Na, Cs and Yb, most preferably from Li, Na and Yb.

The redox dopant may be essentially non-emissive.

Hole Injection Layer

The hole injection layer may improve interface properties between the anode and an organic material used for the hole transport layer, and is applied on a non-planarized anode and thus planarizes the surface of the anode. For example, the hole injection layer may include a material having a median value of the energy level of its highest occupied molecular orbital (HOMO) between the work function of the anode material and the energy level of the HOMO of the hole transport layer, in order to adjust a difference between the work function of the anode and the energy level of the HOMO of the hole transport layer.

When the hole transport region includes a hole injection layer 36, the hole injection layer may be formed on the anode by any of a variety of methods, for example, vacuum deposition, spin coating, casting, Langmuir-Blodgett (LB) method, or the like.

When hole injection layer is formed using vacuum deposition, vacuum deposition conditions may vary depending on the material that is used to form the hole injection layer, and the desired structure and thermal properties of the hole injection layer to be formed and for example, vacuum deposition may be performed at a temperature of about 100° C. to about 500° C., a pressure of about $10^{-6}$ Pa to about $10^{-1}$ Pa, and a deposition rate of about 0.1 to about 10 nm/sec, but the deposition conditions are not limited thereto.

When the hole injection layer is formed using spin coating, the coating conditions may vary depending on the material that is used to form the hole injection layer, and the desired structure and thermal properties of the hole injection layer to be formed. For example, the coating rate may be in the range of about 2000 rpm to about 5000 rpm, and a temperature at which heat treatment is performed to remove a solvent after coating may be in a range of about 80° C. to about 200° C., but the coating conditions are not limited thereto.

Hole Transport Layer

Conditions for forming the hole transport layer and the electron blocking layer may be defined based on the above-described formation conditions for the hole injection layer.

A thickness of the hole transport part of the charge transport region may be from about 10 nm to about 1000 nm, for example, about 10 nm to about 100 nm. When the hole transport transport part of the charge transport region includes the hole injection layer and the hole transport layer, a thickness of the hole injection layer may be from about 10 nm to about 1000 nm, for example about 10 nm to about 100 nm and a thickness of the hole transport layer may be from about 5 nm to about 200 nm, for example about 10 nm to about 150 nm. When the thicknesses of the hole transport part of the charge transport region, the HIL, and the HTL are within these ranges, satisfactory hole transport characteristics may be obtained without a substantial increase in driving voltage.

Hole transport matrix materials used in the hole transport region are not particularly limited. Preferred are covalent compounds comprising a conjugated system of at least 6 delocalized electrons, preferably organic compounds comprising at least one aromatic ring, more preferably organic compounds comprising at least two aromatic rings, even more preferably organic compounds comprising at least three aromatic rings, most preferably organic compounds comprising at least four aromatic rings. Typical examples of hole transport matrix materials which are widely used in hole transport layers are polycyclic aromatic hydrocarbons, triaryl amine compounds and heterocyclic aromatic compounds. Suitable ranges of frontier orbital energy levels of hole transport matrices useful in various layer of the hole transport region are well-known. In terms of the redox potential of the redox couple HTL matrix/cation radical of the HTL matrix, the preferred values (if measured by cyclic voltammetry against ferrocene/ferrocenium redox couple as reference) may be in the range 0.0-1.0 V, more preferably in the range 0.2-0.7 V, even more preferably in the range 0.3-0.5 V.

The hole transport region of the stack of organic layers shall further include an electrical p-dopant improving conductivity and/or hole injection from the anode, in addition to the materials as described above.

Electrical p-Dopant

The charge-generating material may be homogeneously or inhomogeneously dispersed in the first hole transport layer.

The electrical p-dopant may be one of a quinone derivative, a radialene compound, a metal oxide, and a cyano group-containing compound, but is not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), radialene compounds like PD-2 and the like; metal oxides such as tungsten oxide, molybdenum oxide, and the like; and cyano-containing compounds such as compound HT-D1 below.

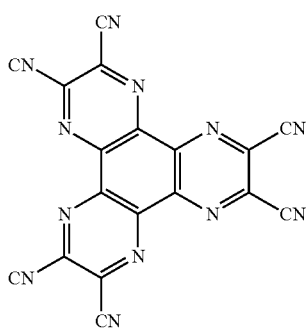

Compound HT-D1

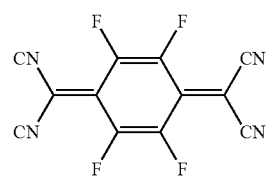

F4-TCNQ

Buffer Layer

The hole transport part of the charge transport region may further include a buffer layer.

Buffer layer that can be suitable used are disclosed in U.S. Pat. Nos. 6,140,763, 6,614,176 and in US2016/248022.

The buffer layer may compensate for an optical resonance distance of light according to a wavelength of the light emitted from the EML, and thus may increase efficiency.

Emission Layer

The emission layer (EML) may be formed on the hole transport region by using vacuum deposition, spin coating, casting, LB method, or the like. When the emission layer is formed using vacuum deposition or spin coating, the conditions for deposition and coating may be similar to those for the formation of the hole injection layer, though the conditions for the deposition and coating may vary depending on the material that is used to form the emission layer. The emission layer may include an emitter host (EML host) and an emitter dopant (further only emitter).

The emitter may be a red, green, or blue emitter.

In one embodiment, the emitter host material is a polar emitter host compound. Preferably the emitter host material can be a polar emitter host compound, which has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In one embodiment, the emitter host material is a polar emitter host compound having at least three aromatic rings, which are independently selected from carbocyclic rings and heterocyclic rings.

In one preferred embodiment, the emitter host material can be a polar emitter host compound having at least three aromatic rings, which are independently selected from carbocyclic rings and heterocyclic rings, which has a has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In one embodiment, the emitter host material is a polar emitter host compound represented by the chemical Formula 1:

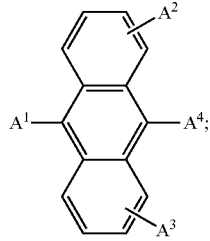

(1)

wherein $A^1$ is selected from the group comprising a substituted or unsubstituted $C_6$-$C_{60}$ aryl or $C_6$-$C_{60}$ heteroaryl;

$A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;

$A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;

$A^4$ is selected from the group comprising a substituted or unsubstituted $C_6$-$C_{60}$ aryl or $C_6$-$C_{60}$ heteroaryl, preferably a $C_6$-$C_{60}$ heteroaryl.

Emitter Host

The polar emitter host compound has at least three aromatic rings, which are independently selected from carbocyclic rings and heterocyclic rings.

The polar emitter host compound may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

According to one embodiment of electroluminescent device the polar emitter host compound has at least three aromatic rings, which are independently selected from carbocyclic rings and heterocyclic rings, and may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye.

In another embodiment, the emitter host compound may have a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.3 Debye to about ≤1.8 Debye, preferably in the range from about ≥0.5 Debye to about ≤1.6 Debye, even more preferred in the range from about ≥0.6 Debye to about ≤1.4 Debye, and most preferred in the range from about ≥0.7 Debye to about ≤1.3 Debye.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom i in the molecule.

The partial charges and atomic positions are computed for the lowest energy conformation of the ground state a molecule in a gas phase, by a standardized method, using the hybrid functional B3LYP with a Gaussian 6-31G* basis set as implemented in the program package TURBOMOLE V6.5. If more than one conformation is viable, the energy of the possible conformations is computed using the hybrid functional B3LYP with a Gaussian 6-31G* basis set as implemented in the program package TURBOMOLE V6.5 first, and the conformation with the lowest total energy is selected to determine the dipole moment.

The dipole moments and redox potentials of selected compounds which are suitable as the second electron transport matrix compound are given in Table 2.

TABLE 2

| Compound | Name | Structure | Dipole moment/ B3LYP_ Gaussian + 6-31G* | Redox potential against Fc/Fc+ in THF/V |
|---|---|---|---|---|
| ETM-1 | 7-(3-(pyren-1-yl)phenyl) dibenzo[c,h] acridine | 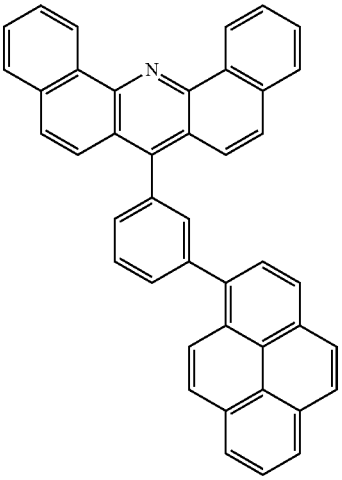 [SMILES: c1cc(-c2c3ccc4ccccc4c3nc3c2ccc2ccccc23)cc(-c2ccc3ccc4cccc5ccc2c3c45)c1] | 1.88 | −2.26 |
| ETM-2 | 7-(3-(pyren-1-yl)phenyl) benzo[c] acridine | 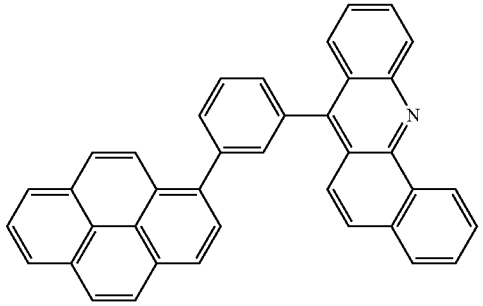 [SMILES: c1cc(-c2c3ccccc3nc3c2ccc2ccccc23)cc(-c2ccc3ccc4cccc5ccc2c3c45)c1] | 2.04 | −2.2 |
| ETM-3 NET-441 A06391 | 2-(3'-(4,6-diphenyl-1,3,5-triazin-2-yl)-[1,1'-biphenyl]-3-yl)-4-phenylbenzo[4,5]thieno[3,2-d]pyrimidine | 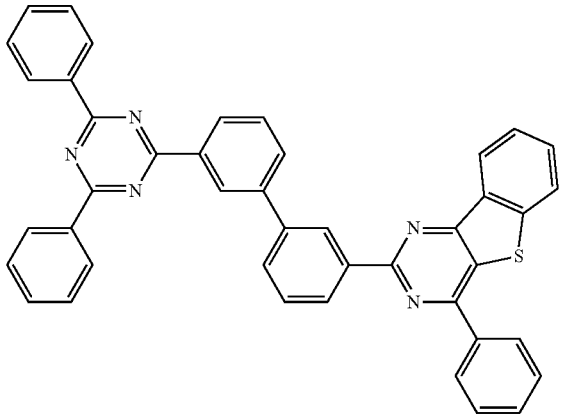 [SMILES: c1ccc(-c2nc(-c3ccccc3)nc(-c3cccc(-c4cccc(-c5nc(-c6ccccc6)c6sc7ccccc7c6n5)c4)c3)n2)cc1] | 2.84 | −2.20 |

TABLE 2-continued

| Compound | Name | Structure | Dipole moment/ B3LYP_ Gaussian + 6-31G* | Redox potential against Fc/Fc+ in THF/V |
|---|---|---|---|---|
| ETM-4 GH0408S A06539 | 2-phenyl-4-(4',5',6'-triphenyl-[1,1':2',1":3",1'''-quaterphenyl]-3'''-yl)benzo[4,5]thieno[3,2-d]pyrimidine | | 1.75 | −2.23 |
| ETM-5 | | | 0.30 | −2.18 |
| ETM-6 | | | −/0.66/1.03 | −2.22 |

TABLE 2-continued
| Compound | Name | Structure | Dipole moment/ B3LYP_ Gaussian + 6-31G* | Redox potential against Fc/Fc+ in THF/V |
|---|---|---|---|---|
| ETM-7 | 7-(4',5',6'-triphenyl-[1,1':2',1'':3'',1'''-quaterphenyl]-3'''-yl)-dibenzo[c,h]acridine | 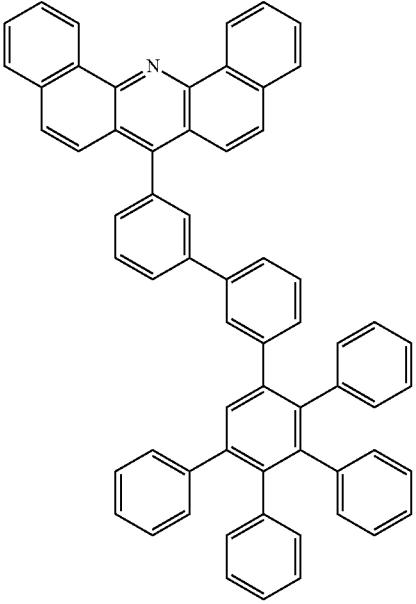 [SMILES: c1ccc(-c2cc(-c3cccc(-c4cccc(-c5c6ccc7ccccc7c6nc6c5ccc5ccccc56)c4)c3)c(-c3ccccc3)c(-c3ccccc3)c2-c2ccccc2)cc1] | 2.74 | −2.29 |
| ETM-8 | 2,9-di(biphenyl-4-yl)-4,7-diphenyl-1,10-phenanthroline (CAS 338734-83-1) | 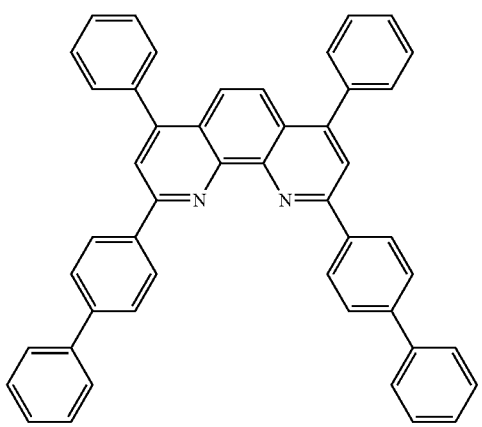 [SMILES: c1ccc(-c2ccc(-c3cc(-c4ccccc4)c4ccc5c(-c6ccccc6)cc(-c6ccc(-c7ccccc7)cc6)nc5c4n3)cc2)cc1] | 3.03 | −2.29 |
| ETM-9 | 2,4,7,9-tetraphenyl-1,10-phenanthroline (CAS 51786-73-3) | 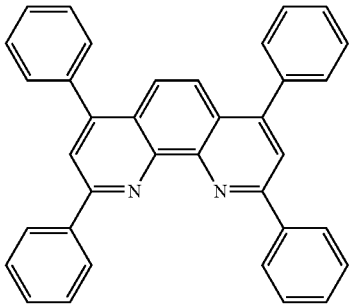 [SMILES: c1ccc(-c2cc(-c3ccccc3)c3ccc4c(-c5ccccc5)cc(-c5ccccc5)nc4c3n2)cc1] | 3.11 | −2.33 |

TABLE 2-continued

| Compound | Name | Structure | Dipole moment/ B3LYP_ Gaussian + 6-31G* | Redox potential against Fc/Fc+ in THF/V |
|---|---|---|---|---|
| ETM-10 | | | 0.59 | −2.20 |
| ETM-11 | | | 0.66 | −2.20 |

According to a further aspect of the invention, the emitter host respectively has a redox potential which, if measured under the same conditions by cyclic voltammetry against Fc/Fc⁺ in tetrahydrofuran, has a value more negative than the respective value obtained for 7-([1,1'-biphenyl]-4-yl)dibenzo[c,h]acridine, preferably more negative than the respective value for 9,9',10,10'-tetraphenyl-2,2'-bianthracene, more preferably more negative than the respective value for 2,9-di([1,1'-biphenyl]-4-yl)-4,7-diphenyl-1,10-phenanthroline, even more preferably more negative than the respective value for 2,4,7,9-tetraphenyl-1,10-phenanthroline, even more preferably more negative than the respective value for 9,10-di(naphthalen-2-yl)-2-phenylanthracene, even more preferably more negative than the respective value for 2,9-bis(2-methoxyphenyl)-4,7-diphenyl-1,10-phenanthroline, most preferably more negative than the respective value for 9,9'-spirobi[fluorene]-2,7-diyl-bis(diphenylphosphine oxide).

The emitter is mixed in a small amount to cause light emission. The emitter may be, for example an inorganic, organic, or organometallic compound, and one or more kinds thereof may be used.

The emitter may be a fluorescent emitter; for example ter-fluorene, 4,4'-bis(4-diphenyl aminostyryl)biphenyl (DPAVBi), 2,5,8,11-tetra-tert-butyl perylene (TBPe), and Compound 4 below are examples of fluorescent blue emitters.

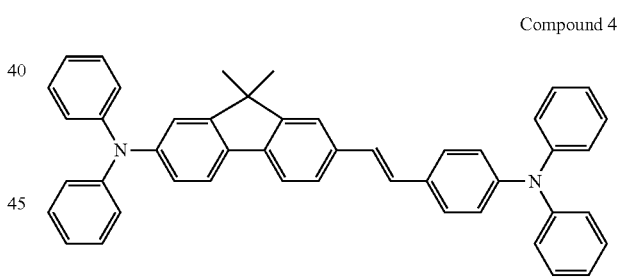

Compound 4

A thickness of the emission layer may be about 10 nm to about 100 nm, for example about 20 nm to about 60 nm. When the thickness of the emission layer is within these ranges, the emission layer may have improved emission characteristics without a substantial increase in a driving voltage.

Electron Injection Layer

According to another aspect of the invention, the organic electroluminescent device may further comprise an electron injection layer between the first electron transport layer and the cathode.

The electron injection layer (EIL) may facilitate injection of electrons from the cathode.

According to another aspect of the invention, the electron injection layer comprises:
(i) an electropositive metal selected from alkali metals, alkaline earth metals and rare earth metals in substantially elemental form, preferably selected from Li, Na, K, Rb, Cs, Mg, Ca, Sr, Ba, Eu and Yb, more preferably from Li, Na, Mg, Ca, Sr and Yb, even more preferably from Li and Yb, most preferably Yb; and/or (ii) an alkali metal complex and/or alkali metal salt, preferably the Li complex and/or salt, more preferably a Li quinolinolate, even more preferably a lithium 8-hydroxyquinolinolate, most preferably the alkali metal salt and/or complex of the second electron transport layer is identical with the alkali metal salt and/or complex of the injection layer.

The electron injection layer may include at least one selected from LiF, NaCl, CsF, $Li_2O$, and BaO.

A thickness of the EIL may be from about 0.1 nm to about 10 nm, or about 0.3 nm to about 9 nm. When the thickness of the electron injection layer is within these ranges, the electron injection layer may have satisfactory electron injection ability without a substantial increase in driving voltage.

Cathode

A material for the cathode may be a metal, an alloy, or an electrically conductive compound that have a low work function, or a combination thereof. Specific examples of the material for the cathode may be lithium (Li), magnesium (Mg), aluminum (Al), aluminum-lithium (Al—Li), calcium (Ca), magnesium-indium (Mg—In), magnesium-silver (Mg—Ag), etc. In order to manufacture a top-emission light-emitting device having a reflective anode deposited on a substrate, the cathode may be formed as a transmissive electrode from, for example, indium tin oxide (ITO) or indium zinc oxide (IZO).

In devices comprising a transparent metal oxide cathode or a reflective metal cathode, the cathode may have a thickness from about 50 nm to about 100 nm, whereas semitransparent metal cathodes may be as thin as from about 5 nm to about 15 nm.

Anode

A material for the anode may be a metal or a metal oxide, or an organic material, preferably a material with work function above about 4.8 eV, more preferably above about 5.1 eV, most preferably above about 5.3 eV. Preferred metals are noble metals like Pt, Au or Ag, preferred metal oxides are transparent metal oxides like ITO or IZO which may be advantageously used in bottom-emitting OLEDs having a reflective cathode.

In devices comprising a transparent metal oxide anode or a reflective metal anode, the anode may have a thickness from about 50 nm to about 100 nm, whereas semitransparent metal anodes may be as thin as from about 5 nm to about 15 nm.

Electroluminescent Device

According to another embodiment of the electroluminescent device, wherein the first hole transport layer is arranged adjacent to the anode layer.

According to another embodiment of the electroluminescent device, wherein the electroluminescent device comprises in addition a second hole transport layer comprising a second hole transport matrix compound, preferably the second hole transport layer is formed of the second hole transport matrix compound, wherein the second hole transport layer is arranged between the first hole transport layer and the light emitting layer, and further preferred the second hole transport layer is adjacent arranged to the first hole transport layer and to the light emitting layer.

According to another embodiment, a display device is provided comprising at least one electroluminescent device according to the invention.

According to another embodiment, the hole transport region may contain a third hole transport layer which can be in direct contact with the emission layer.

According to another embodiment, the third hole transport layer can be in direct contact with the second hole transport layer.

According to another embodiment, the second electron transport layer can be contacting sandwiched between the emission layer and the first electron transport layer.

According to another embodiment, the second electron transport layer can be in direct contact with the emission layer.

According to another embodiment, the first electron transport layer can be contacting sandwiched between the second electron transport layer and the electron injection layer.

According to another embodiment, the first electron transport layer can be in direct contact with the cathode electrode.

According to another embodiment, the second electron transport layer can be contacting sandwiched between the first electron transport layer and the cathode layer.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

Hereinafter, the embodiments are illustrated in more detail with reference to examples. However, the present disclosure is not limited to the following examples

Hereinafter, the figures are illustrated in more detail with reference to examples. However, the present disclosure is not limited to the following figures.

Figure 1:
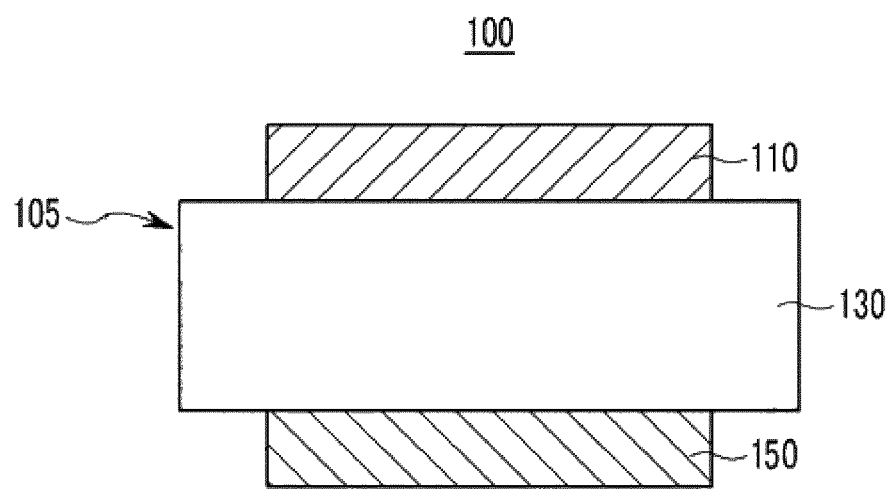
FIG. 1 is a cross-sectional view showing an organic light emitting diode according to an embodiment of the invention.
Figure 2:
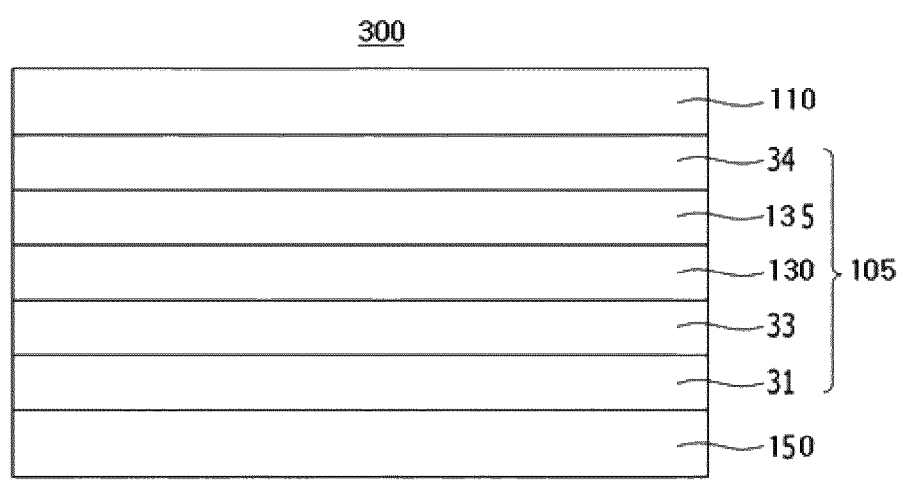
FIGS. 2 and 3 are cross-sectional views specifically showing a part of an organic layer of an organic light emitting diode according to an embodiment of the invention.
Figure 3:
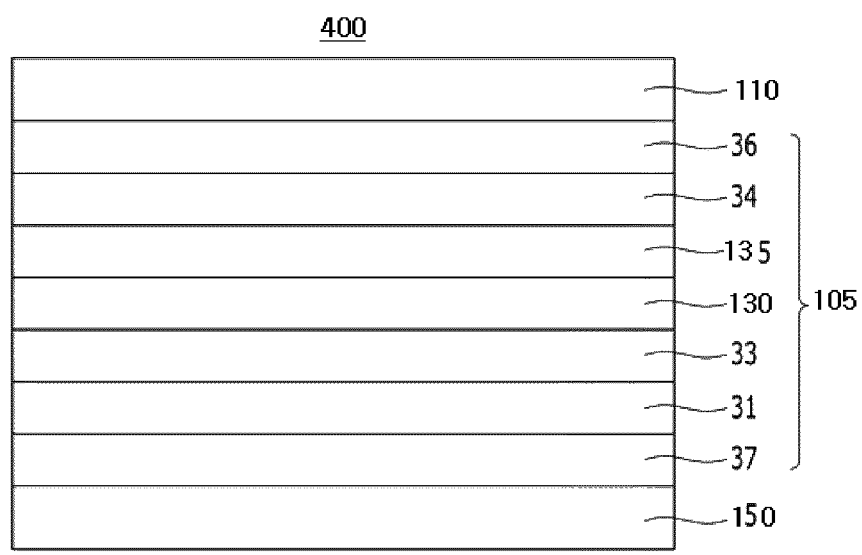

FIGS. 1 to 3 are schematic cross-sectional views of organic light emitting diodes 100, 300, and 400 according to an embodiment of the present invention. Hereinafter, referring to FIG. 1, the structure of an organic light emitting diode according to an embodiment of the present invention and the method of manufacturing the same are as follows. The organic light emitting diode 100 has a structure where an anode 110, a stack of organic layers 105 including a hole transport region (not shown); an electron transport region (not shown); an emission layer 130; and a cathode 150 that are sequentially stacked.

A substrate may be disposed on the anode 110 or under the cathode 150. The substrate may be selected from usual substrate used in a general organic light emitting diode and may be a glass substrate or a transparent plastic substrate.

The anode 110 may be formed by depositing or sputtering an anode material on a substrate. The anode material may be selected from materials having a high work function that makes hole injection easy. The anode 110 may be a reflective electrode, a transflective electrode, or a transmissive electrode. The anode material may use indium tin oxide (ITO), indium zinc oxide (IZO), tin oxide ($SnO_2$), zinc oxide (ZnO), and the like. Or, it may be a metal such as silver (Ag), or gold (Au), or an alloy thereof.

The anode 110 may have a monolayer or a multi-layer structure of two or more layers.

The organic light emitting diodes 100, 300, and 400 according to an embodiment of the present invention may include a hole transport region; an emission layer 130; and the first electron transport layer 31.

Referring to FIG. 2, the stack of organic layers 105 may include at least two layered hole transport layers, and in this case, the hole transport layer contacting the emission layer (130) is defined as a second hole transport layer 135 and the hole transport layer contacting the anode (110) is defined as a first hole transport layer 34. The stack of organic layers 105 further includes two electron transport layers, namely first electron transport layer 31 and the second electron transport layer 33. The first hole transport layer of the stack 105 may have the function of a hole injection layer, and a third hole transport layer, having the function of an electron blocking layer and/or the function of a buffer layer, may be further sandwiched between the second hole transport layer 135 and the emission layer 130.

The hole transport region of the stack 105 may include only a hole injection layer or only a hole transport layer. Or, the hole transport region may have a structure as depicted on FIG. 3, where a hole injection layer 36/hole transport layer 34 or hole injection layer 36/hole transport layer 34/electron blocking layer (135) is sequentially stacked from the anode 110.

For example, an electron injection layer 37 can be additionally included, so that an OLED may comprises an anode 110/first hole transport layer having hole injection function 36/second hole transport layer 34/third hole transport layer having electron blocking function 135/emission layer 130/second electron transport layer 33/first electron transport layer 31/electron injection layer 37/cathode 150, which are sequentially stacked.

According to FIG. 3, the organic electroluminescent device (400) comprises an anode (110), a first hole transport layer (36), a second hole transport layer (34), optional an electron blocking layer (135), an emission layer (130), an optional second electron transport layer (33), first electron transport layer (31), an optional electron injection layer (37), a cathode (150) wherein the layers are arranged in that order.

The first hole transport layer 36 includes at least one electrical p-dopant which may be a material having a median value of the energy level of its highest occupied molecular orbital (HOMO) between the work function of the anode and the energy level of the HOMO of the second hole transport matrix of the second hole transport layer 34, in order to adjust a difference between the work function of the anode and the energy level of the HOMO of the second hole transport matrix of the hole transport layer 34.

Synthesis of Auxiliary Compounds

Compounds ETM-7, ETM-10 and ETM-11 were prepared by methods disclosed in WO2011/154131 and in WO2016/171356.

General Procedure for Fabrication of OLEDs

Model devices were prepared using auxiliary materials according to formulas F1, F2 and PD-2:

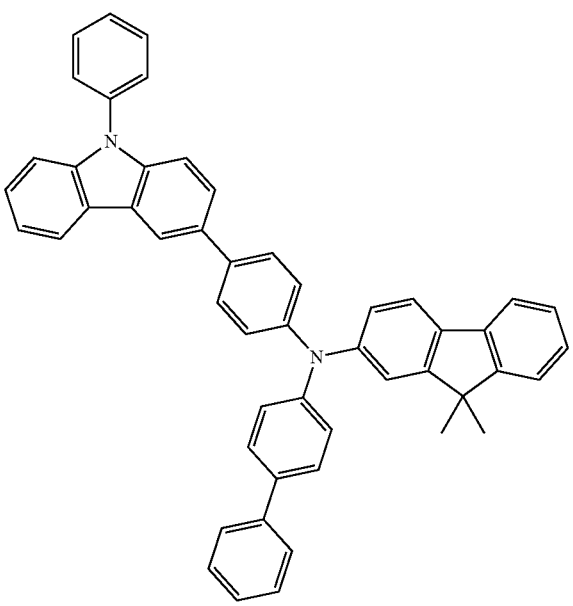 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

biphenyl-4-yl(9,9-diphenyl-9H-fluoren-2-yl)-[4-(9-phenyl-9H-carbazol-3-yl)phenyl]-amine, CAS 1242056-42-3, F1;

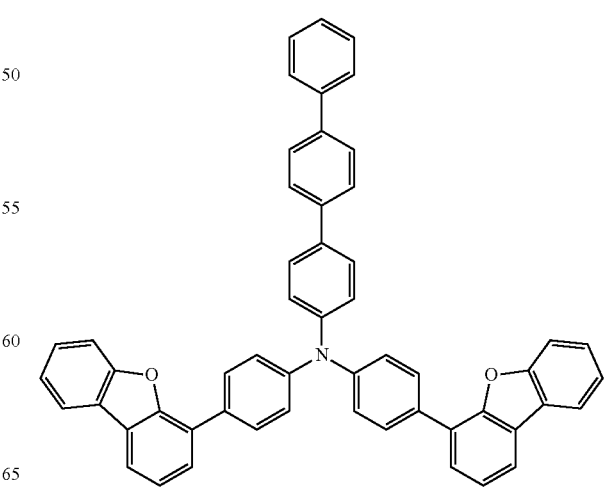

N,N-bis(4-(dibenzo[b,d]furan-4-yl)phenyl)-[1,1': 4',1''-terphenyl]-4-amine, CAS 1198399-61-9, F2;

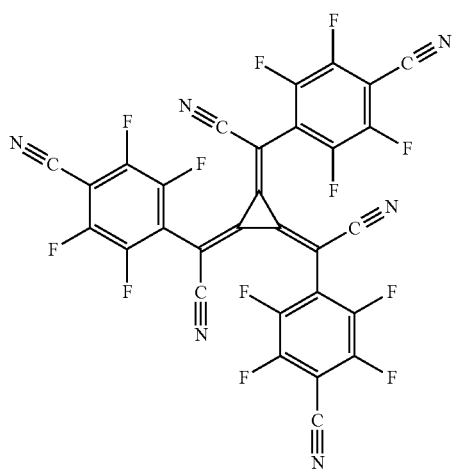 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

2,2',2''-(cyclopropane-1,2,3-triylidene)tris(2-(p-cyanotetrafluorophenyl)acetonitrile), CAS 1224447-88-4, PD-2.

Compound ETM-12 has the following formula:

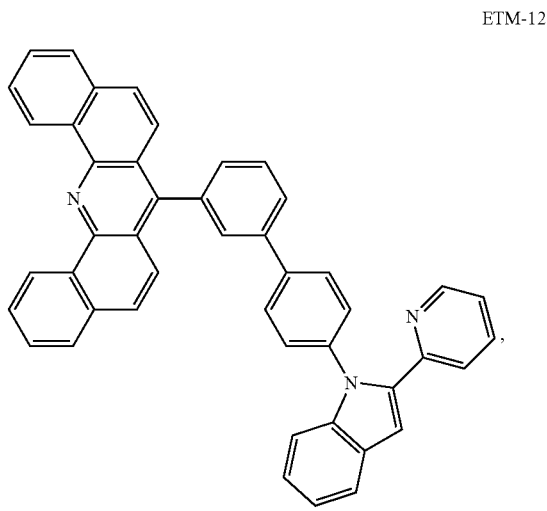 [SMILES: c1ccc(-c2cc3ccccc3n2-c2ccc(-c3cccc(-c4c5ccc6ccccc6c5nc5c4ccc4ccccc45)c3)cc2)nc1]

ETM-12 and its redox potential is −2.27 V.

Device Example 1 (Top Emitting Blue OLED)

On a glass substrate, a 100 nm thick silver layer is deposited by vacuum thermal evaporation (VTE) as an anode, followed by a 10 nm thick first hole transport layer of a compound according to F1 doped with a compound according to formula PD2, wherein the matrix to dopant weight ratio is of 92:8 wt.-%, by a 117 nm thick undoped second hole transport layer made of neat compound according to formula F1 and by 5 nm thick undoped third hole transport layer made of neat compound according to formula F2. Subsequently, a blue fluorescent emitting layer of compound B1 (Sun Fine Chemicals) doped with fluorescent emitter NUBD370 (Sun Fine Chemicals) (97:3 wt %) is deposited with a thickness of 20 nm. A 5 nm thick second electron transport layer of the tested second electron transport matrix compound of table 3 and 33 nm thick first electron transport layer of the first electron transport matrix compound (Vr) doped with elemental ytterbium (90:10 wt %) or, alternatively, with metal alloy ND1 comprising 2.6 wt % Na and 97.4% Zn, are deposited subsequently on the emitting layer. Finally, a silver layer with a thickness of 11 nm is deposited as a cathode on top of the metal-doped layer, followed by 75 nm thick optical outcoupling layer made of neat compound according to formula F1.

The OLED stack may be protected from ambient conditions by encapsulation of the device with a glass slide. Thereby, a cavity is formed, which includes a getter material for further protection.

Evaluation of Device Experiments

To assess the performance of the inventive examples compared to the prior art, the current efficiency is measured under ambient conditions (20° C.). Operational voltage measurements are performed using a Keithley 2400 sourcemeter, and reported in V at standard current density 10 mA/cm$^2$ for top emission devices. For bottom emission devices, the standard current density is usually 15 mA/cm$^2$. A calibrated spectrometer CAS140 from Instrument Systems is used for measurement of CIE coordinates and brightness in Candela. Lifetime LT of the device is measured at ambient conditions (20° C.) and standard current density 10 mA/cm$^2$ or 15 mA/cm$^2$, using a Keithley 2400 sourcemeter, and recorded in hours.

The brightness of the device is measured using a calibrated photo diode. The lifetime LT is defined as the time spent till the brightness of the device is reduced to 97% of its initial value.

The light output in external efficiency EQE and power efficiency $P_{eff}$ (lm/W) are determined at 10 mA/cm$^2$ for top emission devices.

To determine the efficiency EQE in % the light output of the device is measured using a calibrated photodiode.

To determine the power efficiency in lm/W, in a first step the luminance in candela per square meter (cd/m$^2$) is measured with an array spectrometer CAS140 CT from Instrument Systems which has been calibrated by Deutsche Akkreditierungsstelle (DAkkS) In a second step, the luminance is then multiplied by π and divided by the voltage and current density.

In bottom emission devices, the emission is predominately Lambertian and quantified in percent external quantum efficiency (EQE) and power efficiency in lm/W. The results in terms of operational voltage and current efficiency $C_{eff}$ are shown in Table 3.

Table 3a: Top emission device (inventive, see above) comprising a 20 nm thick emission layer consisting of compound B-1 (having dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, 0.94 Debye) with 3 wt % NUBD-370, undoped 5 nm thick second electron transport layer (ETL), 33 nm thick first electron transport layer (EIL1) comprising the first electron transport matrix compound of formula 2, for example compound Vr, doped with 10 wt % of given n-dopant and a 11 nm thin silver cathode. ND-1 is an alloy comprising 2.6 wt % Na and 97.4% Zn.

Compound C1 (CAS 1214263-47-4) has dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, 0.14 Debye. Performance of comparative devices is given in Table 3b.

TABLE 3a

| Example | Second ETL | first ETL matrix | n-dopant | V at 15 mA·cm$^{-2}$ V | $C_{eff}$/CIEy cd/A at 15 mA·cm$^{-2}$ | LT h |
|---|---|---|---|---|---|---|
| 1a | ETM-7 | Vr | Yb | 3.228 | 152.7 | 60 |
| 1b | ETM-8 | Vr | Yb | 3.275 | 151.6 | 31 |
| 1c | ETM-9 | Vr | ND-1 | 3.208 | 142.8 | 43 |
| 1d | ETM-12 | Vr | ND-1 | 3.249 | 157.9 | 25 |

TABLE 3b

| Top emission device (comparative) | | | | | | |
|---|---|---|---|---|---|---|
| Example | Second ETL | first ETL matrix | n-dopant | V at 15 mA·cm$^{-2}$ V | $C_{eff}$/CIEy cd/A at 15 mA·cm$^{-2}$ | LT h |
| 1a | ETM-7 | Vr | Yb | 3.541 | 130.4 | 30 |
| 1b | ETM-8 | Vr | Yb | 3.594 | 138.5 | 31 |
| 1c | ETM-9 | Vr | ND-1 | 3.351 | 112.9 | 5 |
| 1d | ETM-12 | Vr | ND-1 | 3.538 | 138.1 | 36 |

Comparative devices are completely analogous to the device of table 3a, except that the inventive emitter host B1 is replaced with less polar compound ABH-113 having structure according to formula C1

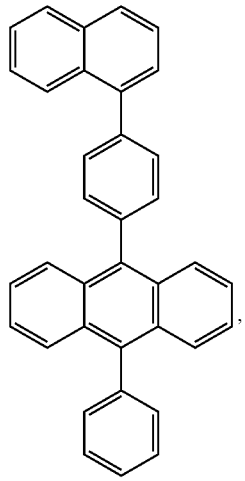

C1

Comparison of results for inventive devices according to Table 3a and comparative devices according to Table 3b shows that matching the dipole moment of the emitter host with adjacent layers as required by the present invention significantly improves device performance.

Analogously as in Example 1, a further device lacking the second electron transport layer was prepared. Comparative devices 2A, 2B and 2C were prepared with compound C1 as emitter host instead of compound B1. The results in terms of colour coordinate y, operational voltage, current efficiency $C_{eff}$ and power efficiency $P_{eff}$ are reported in Table 4.

TABLE 4

| Example | n-dopant/ first ETL matrix | V at 10 mA·cm$^{-2}$ V | $C_{eff}$ cd/A at 10 mA·cm$^{-2}$ | $C_{eff}$/CIEy cd/A at 10 mA·cm$^{-2}$ | $P_{eff}$ lm/W at 10 mA·cm$^{-2}$ | CIEy1931 |
|---|---|---|---|---|---|---|
| 2a | Yb/Vr | 3.20 | 6.07 | 110 | 5.96 | 0.055 |
| 2b | Yb/MX12 | 3.49 | 5.43 | 98.1 | 4.88 | 0.055 |
| 2c | Yb/MX11 | 3.72 | 4.68 | 84.9 | 3.96 | 0.055 |
| 2A | Yb/Vr | 3.33 | 5.05 | 91.2 | 4.76 | 0.055 |

TABLE 4-continued

| Example | n-dopant/ first ETL matrix | V at 10 mA·cm$^{-2}$ V | $C_{eff}$ cd/A at 10 mA·cm$^{-2}$ | $C_{eff}$/CIEy cd/A at 10 mA·cm$^{-2}$ | $P_{eff}$ lm/W at 10 mA·cm$^{-2}$ | CIEy1931 |
|---|---|---|---|---|---|---|
| 2B | Yb/MX12 | 3.78 | 5.27 | 95.1 | 4.38 | 0.055 |
| 2C | Yb/MX11 | 4.06 | 4.18 | 77.4 | 3.24 | 0.054 |

Comparison of results for inventive devices 2a, 2b and 2c with results for corresponding comparative devices 2A, 2B and 2C, respectively, shows that even if the second electron transport layer is omitted, matching the dipole moment of the emitter host with adjacent layers as required by the present invention significantly improves device performance.

Table 5 gives energy levels and dipole moments, computed using the hybrid functional B3LYP with a Gaussian 6-31G* basis set as implemented in the program package TURBOMOLE V6.5 for the respective lowest energy conformers found by the program package TURBOMOLE V6.5 using the hybrid functional B3LYP with a Gaussian 6-31G* basis set, for exemplary emitter hosts B1-B7.

TABLE 5

| Structure | HOMO [eV] | LUMO [eV] | E_Gap [eV] | Dipole [Debye] |
|---|---|---|---|---|
| B1 | −5.13 | −1.65 | 3.48 | 0.93 |
| B2 | −5.11 | −1.63 | 3.48 | 0.64 |
| B3 | −5.11 | −1.65 | 3.46 | 0.92 |
| B4 | −5.21 | −1.58 | 3.63 | 0.77 |
| B5 | −5.16 | −1.55 | 3.61 | 1.00 |
| B6 | −5.18 | −1.58 | 3.60 | 1.51 |
| B7 | −5.10 | −1.64 | 3.46 | 1.37 |

It is evident that introduction of a furane and/or thiophene ring increases the dipole moment of the lowest energy conformer in comparison with the compound C1 significantly.

It is to be understood that wherever values and ranges are provided herein, all values and ranges encompassed by these values and ranges, are meant to be encompassed within the scope of the present invention. Moreover, all values that fall within these ranges, as well as the upper or lower limits of a range of values, are also contemplated by the present application.

The invention claimed is:

1. An electroluminescent device comprising:
   at least one anode layer,
   at least one cathode layer,
   at least one light emitting layer,
   at least one first hole transport layer,
   at least a first electron transport layer;
   wherein for increasing power efficiency the compositions of the light emitting layer, the hole transport layer and the electron transport layer are matched to one another, wherein
      the at least one light emitting layer is arranged between the anode layer and the cathode layer, wherein the at least one light emitting layer comprises:
         at least one fluorescent emitter compound embedded in at least one polar emitter host compound, wherein
         the at least one polar emitter host compound has at least three aromatic rings, which are independently selected from carbocyclic rings and heterocyclic rings;
      the at least one first hole transport layer is arranged between the anode layer and the light emitting layer, wherein the at least one first hole transport layer comprises:
         at least one electrical p-dopant, or
         at least one electrical p-dopant and at least one first hole transport matrix compound;
      the at least one first electron transport layer is arranged between the cathode layer and the light emitting layer, wherein the first electron transport layer comprises:
         at least one redox n-dopant, and
         at least one first electron transport matrix compound.

2. The electroluminescent device according to claim 1 comprising:
   at least one anode layer,
   at least one cathode layer,
   at least one light emitting layer,
   at least one first hole transport layer,
   at least a first electron transport layer;
   wherein for increasing power efficiency the compositions of the light emitting layer, the hole transport layer and the electron transport layer are matched to one another, wherein
      the at least one light emitting layer is arranged between the anode layer and the cathode layer, wherein the at least one light emitting layer comprises:
         at least one fluorescent emitter compound embedded in at least one polar emitter host compound, wherein
         the at least one polar emitter host compound has at least three aromatic rings, which are independently selected from carbocyclic rings and heterocyclic rings, and has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.2 Debye to about ≤2.0 Debye;
      the at least one first hole transport layer is arranged between the anode layer and the light emitting layer, wherein the at least one first hole transport layer comprises:
         at least one electrical p-dopant, or
         at least one electrical p-dopant and at least one first hole transport matrix compound;
      the at least one first electron transport layer is arranged between the cathode layer and the light emitting layer, wherein the first electron transport layer comprises:
         at least one redox n-dopant, and
         at least one first electron transport matrix compound.

3. The electroluminescent device of claim 1, wherein
for the at least one light emitting layer:
  the emitter host compound comprises 4, 5, 6, 7, 8, 9, 10, 11 or 12 aromatic rings, which are independently selected from carbocyclic rings and heterocyclic rings; and
for the at least one first hole transport layer:
  the electrical p-dopant is selected from the group comprising:
  a) organic compounds comprising at least one electron withdrawing group(s) selected from:
    (i) perhalogenated alkyl,
    (ii) carbonyl group,
    (iii) sulfonyl group,
    (iv) nitrile group and
    (v) nitro group;
  b) metal oxides, metal salts and metal complexes, wherein the metal in the metal oxide, metal salt and/or the metal complex; and
  the optional at least one first hole transport matrix compound is selected from covalent compounds comprising a conjugated system of at least 6 delocalized electrons;
for the at least one first electron transport layer:
  the redox n-dopant is selected from the group comprising:
  a) elemental metals;
  b) organic radicals;
  c) transition metal complexes, wherein the transition metal is selected from $3^{rd}$, $4^{th}$, $5^{th}$ $6^{th}$, $7^{rd}$, $8^{th}$, $9^{th}$ or $10^{th}$ group of the Periodic Table and is in oxidation state (—I), (0), (I) or (II);
  the at least one first electron transport matrix compound is selected from covalent compounds comprising a conjugated system of at least 6 delocalized electrons.

4. The electroluminescent device according to claim 1, wherein
  the emitter host compound has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from about ≥0.3 Debye to about ≤1.8 Debye;
  the first electron transport matrix compound comprises at least one phosphine oxide group or at least one phenanthroline group.

5. The electroluminescent device according to claim 1, wherein
  the polar emitter host compound is an anthracene compound represented by the chemical Formula 1:

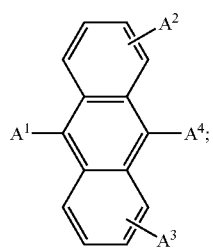

(1)

wherein
  $A^1$ is selected from the group comprising a substituted or unsubstituted $C_6$-$C_{60}$ aryl or $C_6$-$C_{60}$ heteroaryl;
  $A^2$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
  $A^3$ is selected from the group comprising a substituted or unsubstituted $C_1$ to $C_{10}$ alkyl group, a substituted or unsubstituted $C_6$-$C_{60}$ aryl or $C_6$-$C_{60}$ heteroaryl;
  $A^4$ is selected from the group comprising a substituted or unsubstituted $C_6$-$C_{60}$ aryl or $C_6$-$C_{60}$ heteroaryl; and
  the first electron transport matrix compound has the chemical formula 2:

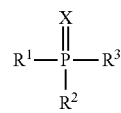

Formula (2)

wherein
  X is selected from O, S, Se;
  $R^1$ and $R^2$ are independently selected from $C_1$ to $C_{12}$ alkyl, $C_6$ to $C_{20}$ aryl and $C_5$ to $C_{20}$ heteroaryl;
  $R^3$ is selected from formula (2A),

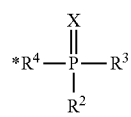

Formula (2A)

or formula (2B)

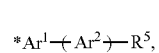

Formula (2B)

wherein
  * marks the position in the respective $R^4$ or $Ar^1$ group for binding the $R^4$ or $Ar^1$ to the phosphorus atom in formula (2);
  $R^4$ is selected from $C_1$ to $C_8$ alkyl, $C_6$ to $C_{20}$ aryl and $C_5$ to $C_{20}$ heteroaryl;
  $Ar^1$ is selected from $C_6$ to $C_{20}$ aryl and $C_5$ to $C_{20}$ heteroaryl;
  $Ar^2$ is selected from $C_{18}$ to $C_{40}$ aryl and $C_{10}$ to $C_{40}$ heteroaryl;
  $R^5$ is selected from H, $C_1$ to $C_{12}$ alkyl, $C_6$ to $C_{20}$ aryl and $C_5$ to $C_{20}$ heteroaryl
  n is selected from 0, 1, or 2.

6. The electroluminescent device according to claim 5, wherein
  in chemical Formula 1 the hetero atom of the $C_6$-$C_{60}$ heteroaryl is selected from the group comprising N, O and/or S; and
  in chemical Formula 2 at least one or all of $R^1$, $R^2$, $R^5$, $Ar^1$ and $Ar^2$ are substituted with $C_1$ to $C_{12}$ alkyl and $C_1$ to $C_{12}$ heteroalkyl groups.

7. The electroluminescent device according to claim 5, wherein
  in chemical Formula 1:
    the $C_6$-$C_{60}$ heteroaryl comprises at least one five-membered ring; or the $C_6$-$C_{60}$ aryl comprises an anthracene or benzoanthracene; or the $C_6$-$C_{60}$ heteroaryl comprises a benzofuran, dibenzofuran, benzo-naphtofuran or dinaphtofuran; and in chemical Formula 2:

two substituents selected from $R^1$, $R^2$ and $R^3$ form with the phosphorus atom a 7-membered phosphepine ring.

8. The electroluminescent device according to claim 5, wherein in chemical Formula 1:

$A^4$ has the following formulas (IIa) to (IIi):

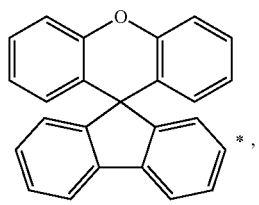
(IIa)

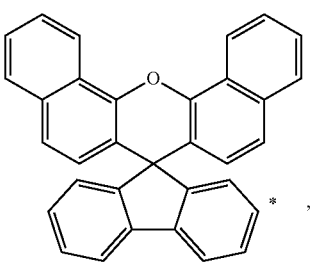
(IIb)

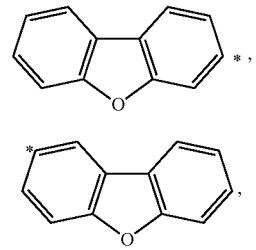
(IIc)

(IId)

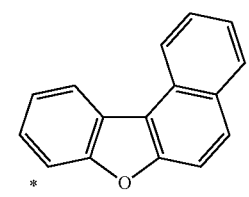
(IIe)

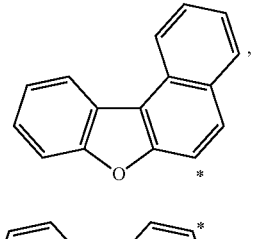
(IIf)

(IIg)

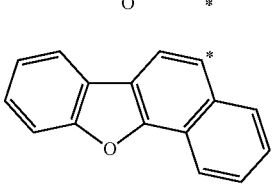

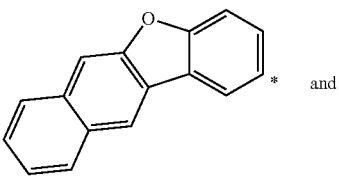
(IIh)
and

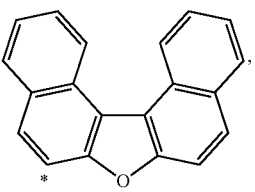
(IIi)

wherein * marks the binding position for the respective $A^4$ group to the anthracene compound.

9. The electroluminescent device according to claim 5, wherein the anthracene compound according to chemical Formula 1 is selected from the group of Formula B1 to B7:

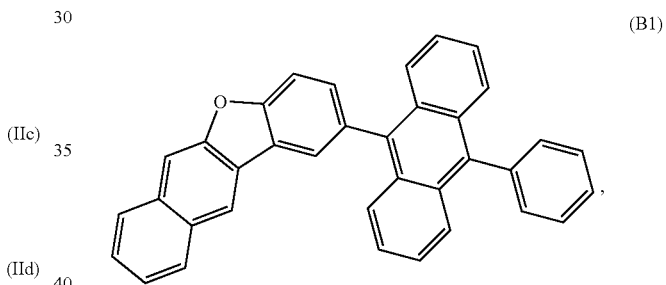
(B1)

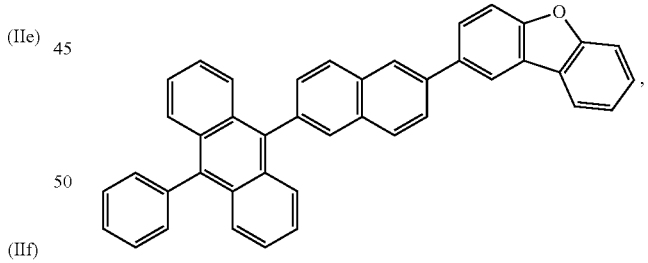
(B2)

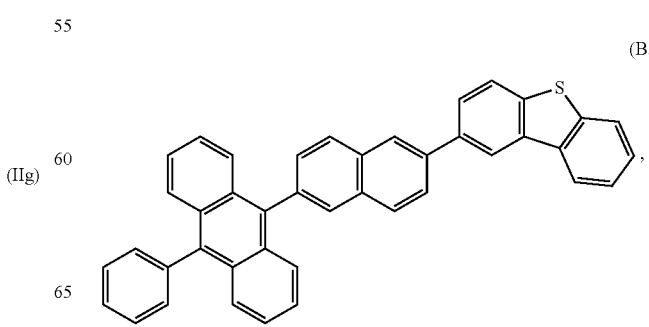
(B3)

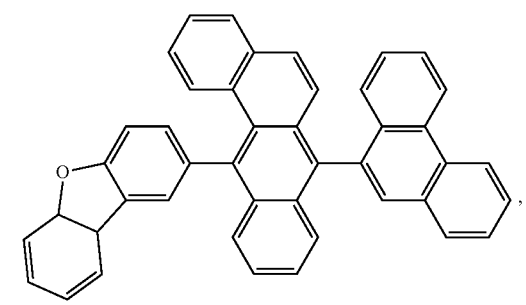
(B4)
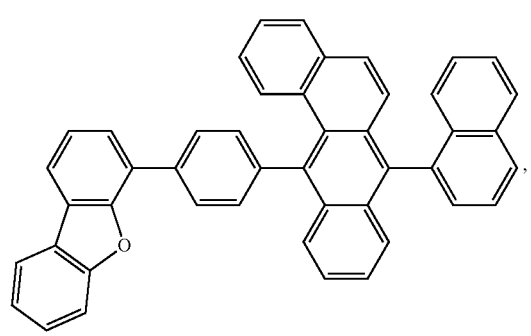
(B5)
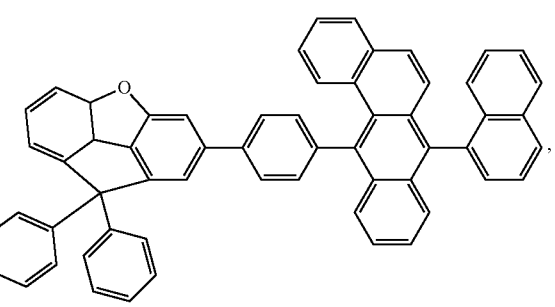
(B6)
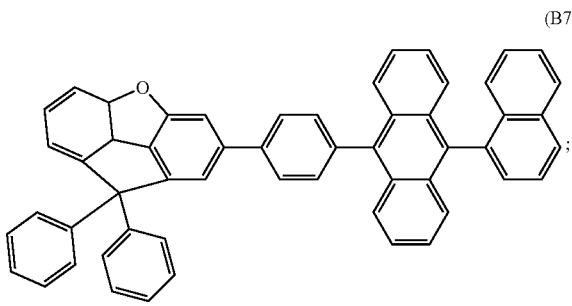
(B7)
and
the first electron transport aromatic matrix compound comprising a phosphine oxide group according to chemical Formula 2 is selected from the group of Formula Va to Vai:
Formula Va to Ve:
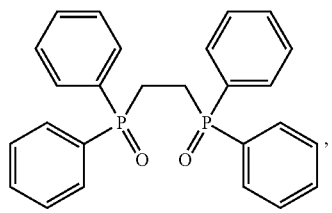
(Va)
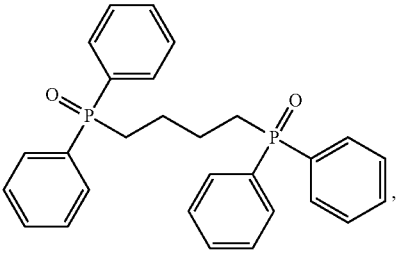
(Vb)
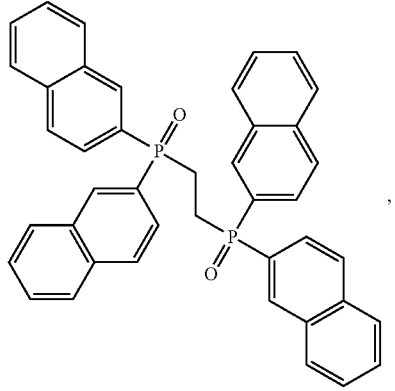
(Vc)
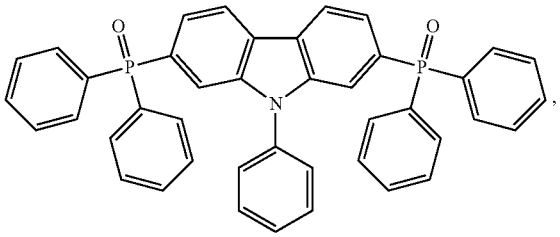
(Vd)
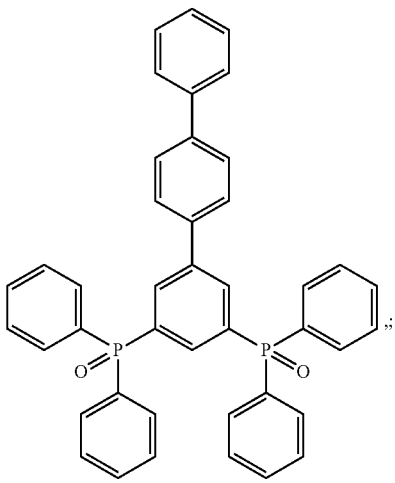
(Ve)
or Formula Vf to Vq:
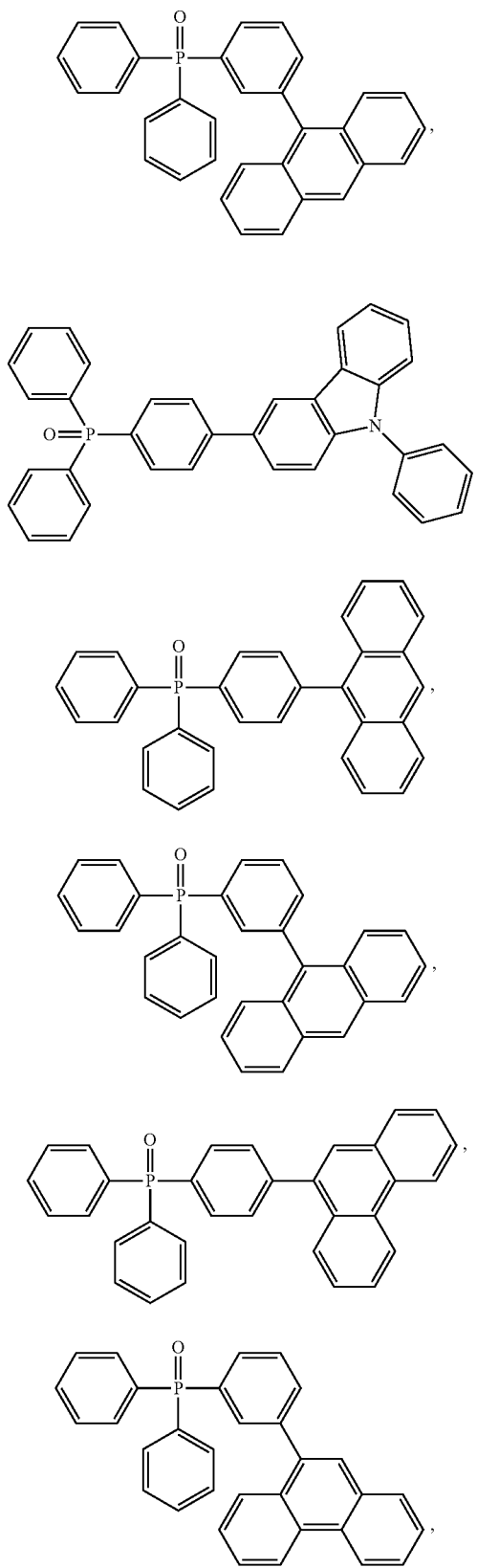
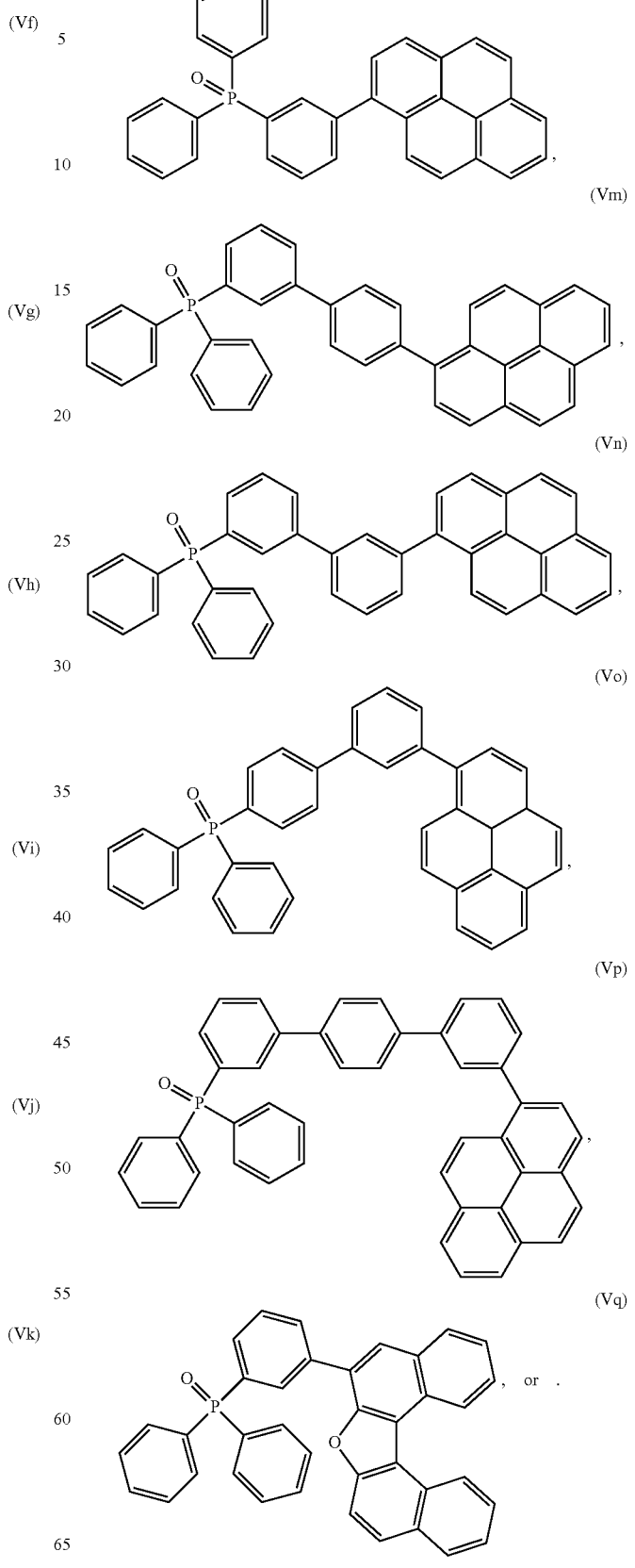

or
Formula Vr to Vt:
(Vr)
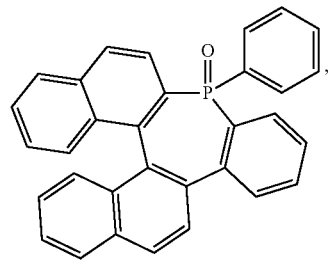
(Vs)
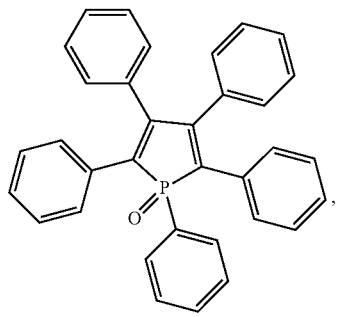
(Vt)
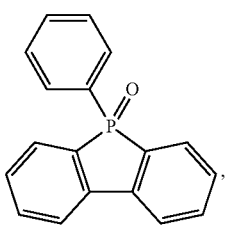
Formula Vu to Vai:
(Vu)
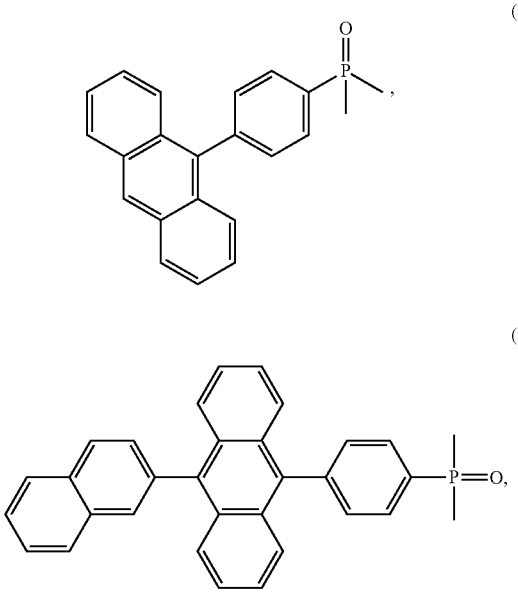
(Vv)
(Vw)
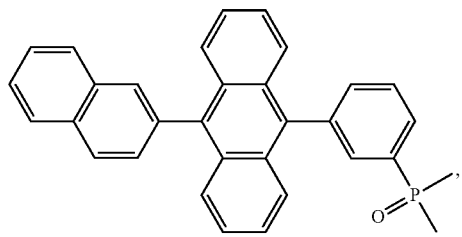
(Vx)
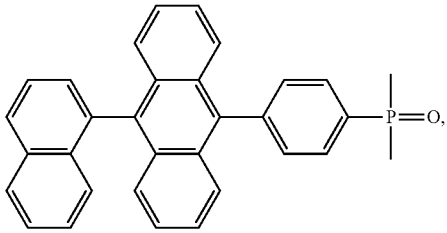
(Vy)
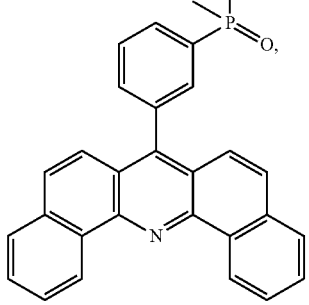
(Vz)
(Vaa)
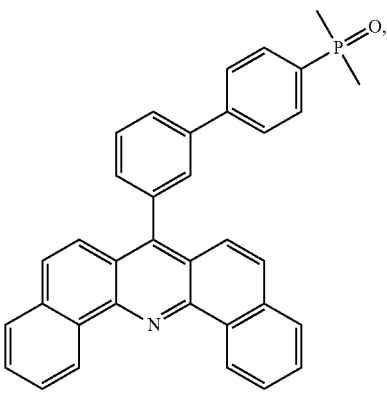

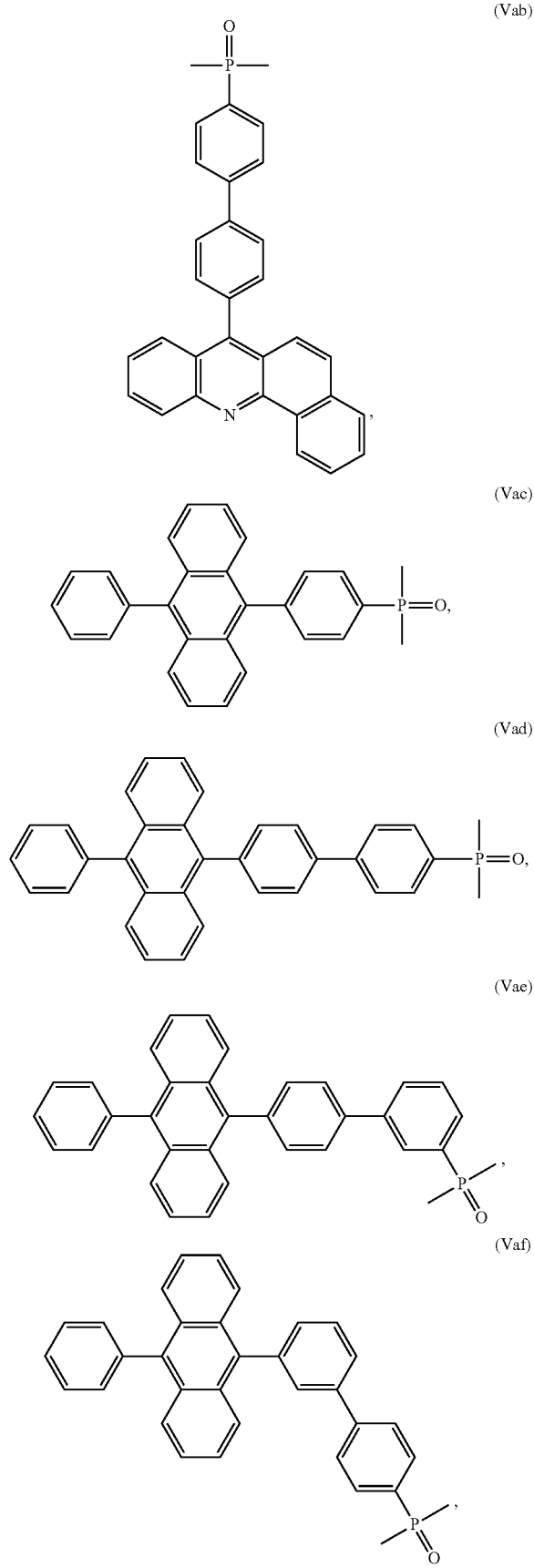

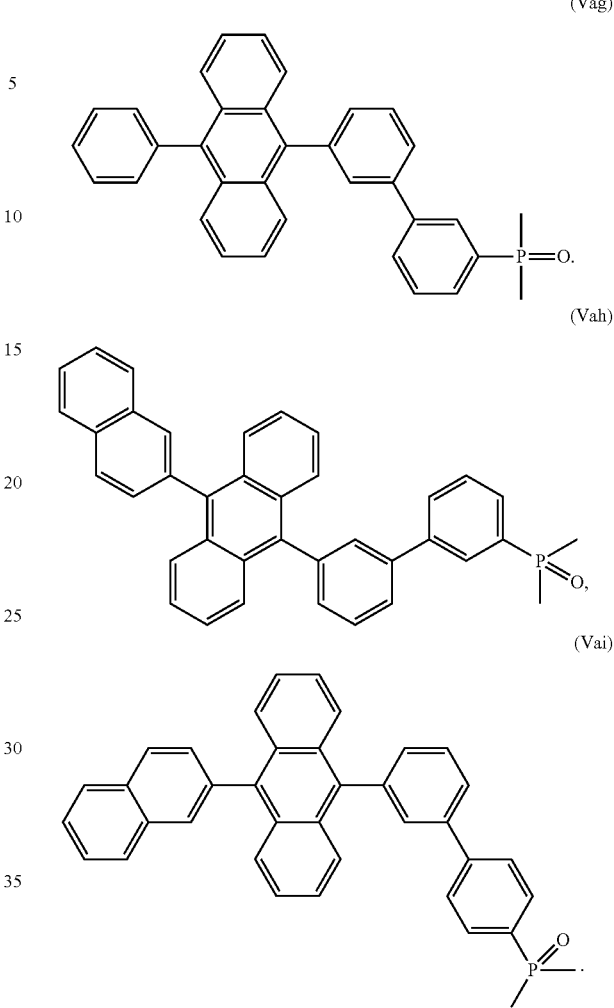

10. The electroluminescent device according to claim 1, wherein the device comprises in addition a second electron transport layer comprising at least one second electron transport matrix compound which is selected from covalent compounds comprising a conjugated system of at least 6 delocalized electrons;

wherein the second electron transport layer is arranged between the first electron transport layer and the light emitting layer.

11. The electroluminescent device according to claim 1, wherein the second electron transport compound has a redox potential, measured by cyclic voltammetry with potentiostatic device Metrohm PGSTAT30 and software Metrohm Autolab GPES at room temperature, in an argon de-aerated, dry 0.1M tetrahydrofuran solution of the tested substance, under argon atmosphere, with 0.1M tetrabutylammonium hexafluorophosphate supporting electrolyte, between platinum working electrodes and with an Ag/AgCl pseudo-standard electrode consisting of a silver wire covered by silver chloride and immersed directly in the measured solution, with the scan rate 100 mV/s, in the range from −2.2 to −2.4 V, against ferrocene/ferrocenium redox couple as a reference.

12. The electroluminescent device according to claim 1, wherein the second electron transport aromatic matrix compound has a gas phase dipole moment, computed using the hybrid functional B3LYP with a Gaussian 6-31G* basis set as implemented in the program package TURBOMOLE V6.5 for the lowest energy conformer found by the program package TURBOMOLE V6.5 using the hybrid functional B3LYP with a Gaussian 6-31G* basis set, in the range from 0.1 Debye to 5.0 Debye.

13. The electroluminescent device according to claim 1, wherein the first hole transport layer is arranged adjacent to the anode layer.

14. The electroluminescent device according to claim 13, comprises in addition a second hole transport layer comprising a second hole transport matrix compound which is selected from covalent compounds comprising a conjugated system of at least 6 delocalized electrons.

15. A display device comprising at least one electroluminescent device according to claim 1.

16. A lighting device comprising at least one electroluminescent device according to claim 1.

17. The electroluminescent device of claim 3, wherein at least three aromatic rings in the emitter host compound are condensed aromatic rings.

18. The electroluminescent device of claim 3, wherein at least one aromatic ring of the emitter host compound is a five- or six-membered heterocyclic ring.

19. The electroluminescent device of claim 3, wherein at least one aromatic ring is a five-membered heterocyclic ring containing one atom selected from the group consisting of N, O, and S.

20. The electroluminescent device of claim 19, wherein the five-membered heterocyclic ring is a furan ring.

* * * * *

UNITED STATES PATENT AND TRADEMARK OFFICE
CERTIFICATE OF CORRECTION

PATENT NO. : 11,411,195 B2
APPLICATION NO. : 16/481902
DATED : August 9, 2022
INVENTOR(S) : Vygintas Jankus, Domagoj Pavicic and Carsten Rothe It is certified that error appears in the above-identified patent and that said Letters Patent is hereby corrected as shown below:

In the Specification

At Column 25, Lines 21-29, and In the Claims, at Column 90, Lines 26-34, in Claim 5, please replace:

" 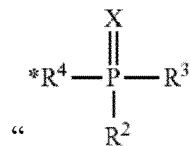 Formula (2A) "

With:

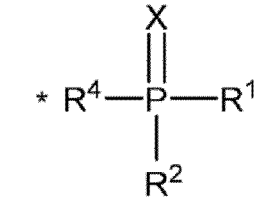 Formula (2A)

Signed and Sealed this
Twenty-second Day of November, 2022

Katherine Kelly Vidal
*Director of the United States Patent and Trademark Office*